US012635231B2

(12) United States Patent
Hsu et al.

(10) Patent No.: US 12,635,231 B2
(45) Date of Patent: May 19, 2026

(54) INTEGRATED LOW-VOLTAGE FINFETS AND HIGH-VOLTAGE PLANAR TRANSISTORS

(71) Applicant: UNITED MICROELECTRONICS CORP., Hsin-Chu City (TW)

(72) Inventors: Chih-Kai Hsu, Tainan City (TW);
Ssu-I Fu, Kaohsiung City (TW);
Yu-Hsiang Lin, New Taipei City (TW);
Chien-Ting Lin, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 435 days.

(21) Appl. No.: 17/668,393

(22) Filed: Feb. 10, 2022

(65) Prior Publication Data

US 2023/0197718 A1 Jun. 22, 2023

(30) Foreign Application Priority Data

Dec. 20, 2021 (CN) .......................... 202111562477.5

(51) Int. Cl.
| | |
|---|---|
| *H10D 84/83* | (2025.01) |
| *H10D 64/27* | (2025.01) |
| *H10D 84/01* | (2026.01) |
| *H10D 84/03* | (2025.01) |
| *H10D 89/60* | (2025.01) |

(52) U.S. Cl.
CPC ......... *H10D 84/834* (2025.01); *H10D 64/512* (2025.01); *H10D 64/514* (2025.01); *H10D 84/0151* (2025.01); *H10D 84/0158* (2025.01); *H10D 84/038* (2025.01);
(Continued)

(58) Field of Classification Search
CPC ... H01L 27/0248–0251; H01L 27/0296; H01L 21/823437; H01L 21/823456; H10D 84/80; H10D 84/82–83; H10D 84/83138–8314; H10D 84/834; H10D 89/601; H10D 89/931
See application file for complete search history.

(56) References Cited

U.S. PATENT DOCUMENTS

| | | | |
|---|---|---|---|
| 10,090,410 B1 | 10/2018 | Chi | |
| 2004/0195568 A1* | 10/2004 | Okumura | .......... H01L 29/78624 |
| | | | 257/E29.279 |

(Continued)

FOREIGN PATENT DOCUMENTS

| | | |
|---|---|---|
| CN | 107689372 A | 2/2018 |
| TW | I550867 B | 9/2016 |

*Primary Examiner* — Christine S. Kim
*Assistant Examiner* — Tyler J Wiegand
(74) *Attorney, Agent, or Firm* — Winston Hsu

(57) ABSTRACT

A semiconductor device includes a substrate, a first transistor, a second transistor and a third transistor. The substrate includes a high-voltage (HV) area, a medium-voltage (MV) area, and a low-voltage (LV) area. The first transistor is disposed in the HV area and includes a first gate dielectric layer and a first gate electrode. The second transistor is disposed in the LV area and includes a plurality of fin-shaped structures and a second gate electrode. The third transistor is disposed in the MV area and includes a third gate dielectric layer and a third gate electrode. The topmost surfaces of the first gate electrode, the second gate electrode and the third gate electrode are coplanar with each other.

13 Claims, 18 Drawing Sheets

(52) U.S. Cl.
CPC ......... *H10D 89/601* (2025.01); *H10D 89/931*
(2025.01); *H10D 84/0144* (2025.01); *H10D*
*84/0149* (2025.01)

(56) References Cited

U.S. PATENT DOCUMENTS

| | | | | |
|---|---|---|---|---|
| 2017/0025533 A1* | 1/2017 | Phoa | ................... | H01L 27/0886 |
| 2023/0154922 A1* | 5/2023 | Yang | ................... | H01L 27/0924 |
| | | | | 257/369 |
| 2023/0197523 A1* | 6/2023 | Hsu | ................ | H01L 21/823412 |
| | | | | 257/392 |
| 2023/0197710 A1* | 6/2023 | Hsu | ................... | H01L 29/66621 |
| | | | | 257/355 |

* cited by examiner

INTEGRATED LOW-VOLTAGE FINFETS AND HIGH-VOLTAGE PLANAR TRANSISTORS

BACKGROUND OF THE INVENTION

1. Field of the Invention

The present disclosure relates generally to a semiconductor device and a method of fabricating the same, and more particularly to a semiconductor device including high-voltage (HV) components, medium-voltage (MV) components, and low-voltage (LV) components together and a method of fabricating the same.

2. Description of the Prior Art

According to the current semiconductor technology, it is able to integrate control circuits, memories, low-voltage operating circuits, and high-voltage operating circuits and components on a single chip together, thereby reducing costs and improving operating efficiency. High-voltage components such as vertical double-diffusion metal-oxide-semiconductor (VDMOS), insulated gate bipolar transistor (IGBT), lateral-diffusion metal-oxide-semiconductor (LD-MOS), etc. fabricated in a chip are used in various applications due to their better power switching efficiency. Those skilled in the art should know that the aforementioned high-voltage components are often required to withstand higher breakdown voltages and operate at lower resistance values.

In addition, as the size of semiconductor components becomes smaller and smaller, there are many improvements in the process steps of forming transistors to fabricate transistors with small volume and high quality. For example, non-planar field effect transistors, such as fin field effect transistors (FinFETs), have replaced planar field effect transistors as the current mainstream development trend. However, as the size of devices continues to decrease, it becomes more difficult to dispose high-voltage components and fin field effect transistors on the same semiconductor device together, and the processes of forming the semiconductor device also faces many limitations and challenges.

SUMMARY OF THE INVENTION

An object of the present disclosure is to provide a semiconductor device, where a high-voltage component and a medium-voltage component are partially embedded in a substrate until they are on the same level with the bottom surface or the top surface of a fin portion of a low-voltage component. Therefore, the topmost surfaces of the high-voltage component, the medium-voltage component, and the low-voltage component are on the same level with each other to avoid forming shallow trench isolation structures with different depths, or to avoid serious loading effect in the subsequent processes, which is helpful to improve the overall performance of the semiconductor device.

An object of the present disclosure is to provide a method of fabricating a semiconductor device, which integrates the processes of forming a high-voltage component, a medium-voltage component, and a low-voltage component, so that the high-voltage component, the medium-voltage component, and the low-voltage component are simultaneously formed under the premise of simplified processes. In addition, the top surfaces of the high-voltage component, the medium-voltage component, and the low-voltage component formed thereby are on the same level with each other, so as to avoid forming shallow trench isolation structures with large differences in depth, or to avoid serious load effect in the subsequent processes.

To achieve the aforementioned objects, the present disclosure provides a semiconductor device that includes a substrate, a first transistor, a second transistor, and a third transistor. The substrate includes a high-voltage area, a medium-voltage area, and a low-voltage area. The first transistor is disposed in the high-voltage area, and includes a first gate dielectric layer disposed on a first plane of the substrate, and a first gate electrode disposed on the first gate dielectric layer. The second transistor is disposed in the low-voltage area, and includes a plurality of fin-shaped structures protruding from a second plane of the substrate, and a second gate electrode crossing the fin-shaped structures. The third transistor is disposed in the medium-voltage area, and includes a third gate dielectric layer disposed on a third plane of the substrate, and a third gate electrode disposed on the third gate dielectric layer. The topmost surface of the first gate electrode, the topmost surface of the second gate electrode, and the topmost surface of the third gate electrode are coplanar with each other.

To achieve the aforementioned objects, the present disclosure provides a semiconductor device that includes a substrate, two first doped regions, a first gate electrode, a second doped region, a second gate electrode, a plurality of fin-shaped structures, a third gate electrode, and a plurality of shallow trench isolation structures. The substrate includes a high-voltage area, a medium-voltage area, and a low-voltage area. The first doped regions are disposed in the substrate and located in the high-voltage area. The first doped regions are parallel to each other and extend along a first direction. The first gate electrode is disposed on the substrate and located in the high-voltage area, and is also disposed between the first doped regions. The second doped region is disposed in the substrate and located in the medium-voltage area. The second doped region extends along the first direction. The second gate electrode is disposed on the substrate and located in the medium-voltage area. The second gate electrode partially covers the second doped region. The fin-shaped structures are disposed in the substrate and located in the low-voltage area. The fin-shaped structures are parallel to each other and extend along the first direction. The third gate electrode is disposed on the substrate and located in the low-voltage area. The third gate electrode extends in a second direction perpendicular to the first direction and crosses the fin-shaped structures. The shallow trench isolation structures are disposed in the substrate to respectively surround the first doped regions, the second doped region, and the fin-shaped structures.

To achieve the aforementioned objects, the present disclosure provides a method of fabricating a semiconductor device, which includes the following steps. First, a substrate is provided. The substrate includes a high-voltage area, a medium-voltage area, and a low-voltage area. Then, a first transistor is formed in the high-voltage area, where the first transistor includes a first gate dielectric layer formed on a first plane of the substrate, and a first gate electrode formed on the first gate dielectric layer. Next, a second transistor is formed in the low-voltage area, where the second transistor includes a plurality of fin-shaped structures protruding from a second plane of the substrate, and a second gate electrode crossing the fin-shaped structures. Afterwards, a third transistor is formed in the medium-voltage area, where the third transistor includes a third gate dielectric layer formed on a third plane of the substrate, and a third gate electrode formed on the third gate dielectric layer. The topmost surface of the first gate electrode, the topmost surface of the second gate electrode, and the topmost surface of the third gate electrode are coplanar with each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

FIG. 1 to FIG. 16 illustrates schematic diagrams of a method of fabricating a semiconductor device according to a first embodiment of the present disclosure, in which:

FIG. 1 is a schematic cross-sectional view of a semiconductor device after an oxidation treatment process;

FIG. 2 is a schematic cross-sectional view of a semiconductor device after an etching process;

FIG. 3 is a schematic cross-sectional view of a semiconductor device after a mask pattern is formed;

FIG. 4 is a schematic cross-sectional view of a semiconductor device after fin-shaped structures are formed;

FIG. 5 is a schematic cross-sectional view of a semiconductor device after a fin cut process;

FIG. 6 is a schematic cross-sectional view of a semiconductor device after a dielectric layer is formed;

FIG. 7 is a schematic cross-sectional view of a semiconductor device after an etching process;

FIG. 8 is a schematic cross-sectional view of a semiconductor device after an ion implantation process;

FIG. 9 is a schematic cross-sectional view of a semiconductor device after a mask structure is formed to expose a high-voltage area;

FIG. 10 is a schematic cross-sectional view of a semiconductor device after a gate dielectric layer is formed in the high-voltage area;

FIG. 11 is a schematic cross-sectional view of a semiconductor device after another ion implantation process;

FIG. 12 is a schematic cross-sectional view of a semiconductor device after further another ion implantation process;

FIG. 13 is a schematic cross-sectional view of a semiconductor device after a gate dielectric layer is formed in a medium-voltage area;

FIG. 14 is a schematic cross-sectional view of a semiconductor device after an etching process is performed in a low-voltage area;

FIG. 15 is a schematic cross-sectional view of a semiconductor device after a gate dielectric layer is formed in the low-voltage area; and FIG. 16 is a schematic cross-sectional view of a semiconductor device after a gate electrode is formed.

FIG. 18 to FIG. 19 illustrates schematic diagrams of a semiconductor device according to a third embodiment of the present disclosure, in which:

FIG. 18 is a schematic cross-sectional view of the semiconductor device of the third embodiment; and FIG. 19 is a schematic top view of the semiconductor device of the third embodiment.

DETAILED DESCRIPTION

The present disclosure may be understood by reference to the following detailed description, taken in conjunction with the drawings as described below. It should be noted that the technical features in different embodiments described in the following may be replaced, recombined, or mixed with one another to constitute another embodiment without departing from the spirit of the present disclosure.

Although the disclosure is described with respect to specific embodiments, the principles of the invention, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person of ordinary skill in the art.

The present disclosure relates to a method of fabricating a semiconductor device, which integrates the fabrication methods of a high-voltage (HV) component, a medium-voltage (MV) component, and a low-voltage (LV) component. The high-voltage component may refer to semiconductor transistors with an initial voltage between 10 volts (V) and 20 volts, the medium-voltage component may refer to semiconductor transistors with an initial voltage between 5 volts and 10 volts, and the low-voltage component may refer to semiconductor transistors with an initial voltage between 0.5 volt and 1 volt, but not limited thereto. Please refer to FIG. 1 to FIG. 16, which are schematic diagrams of a method of fabricating a semiconductor device according to a first embodiment of the present disclosure.

Figure 1:
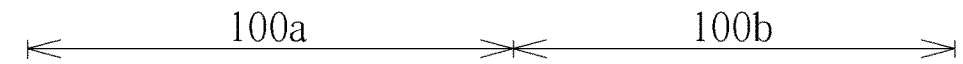
Figure 1:
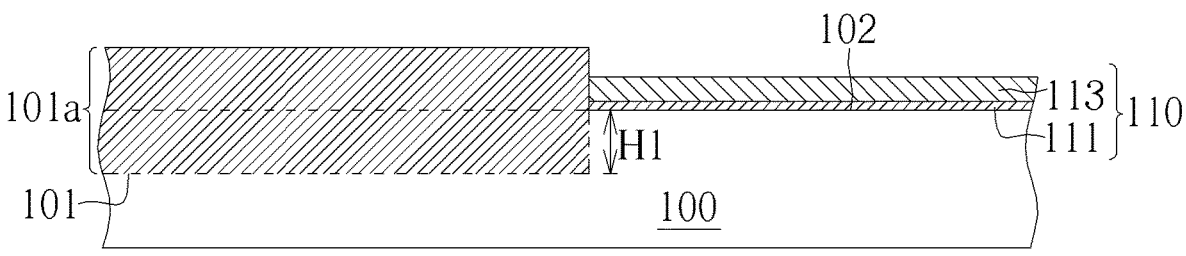

First, referring to FIG. 1, a bulk substrate 100 is provided, which includes, for example, a silicon substrate, an epitaxial silicon substrate, a silicon-containing substrate, or a silicon-on-insulator (SOI) substrate, but not limited thereto. The bulk substrate 100 has at least a first region 100*a* and a second region 100*b*, where the two regions are, for example, disposed adjacent to each other, as shown in FIG. 1. However, in another embodiment, other regions may be further disposed between the first region 100*a* and the second region 100*b* of the bulk substrate 100.

Next, a mask structure 110 is formed on the bulk substrate 100 to cover a surface 102 of the second region 100*b* and to expose the first region 100*a*. In addition, an oxidation treatment process, such as a thermal oxidation process, is performed through the mask structure 110. The mask structure 110 includes, for example, a first mask layer 111 (for example, including silicon oxide) and a second mask layer 113 (for example, including silicon nitride) stacked from bottom to top in sequence, but not limited thereto. It should be noted that during the thermal oxidation process, oxygen is introduced into the exposed first region 100*a* to perform oxidation reaction, so that a portion 101 of the bulk substrate 100 (for example, including silicon) may react with oxygen to form an oxide layer 101*a* (for example, including silicon oxide) with a relatively large volume. The portion 101 of the bulk substrate 100 has a height H1, for example, about 300 angstroms (Å) to about 500 angstroms (Å), but not limited thereto. Therefore, a portion of the oxide layer 101*a* may be embedded in the bulk substrate 100, and another portion of the oxide layer 101*a* may protrude from the topmost surface 102 of the bulk substrate 100, as shown in FIG. 1.

Figure 2:
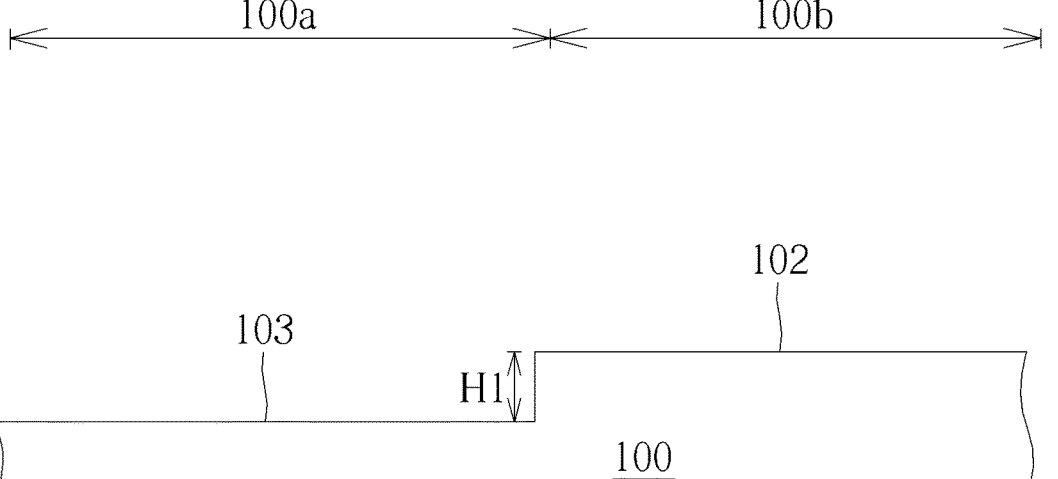
Figure 3:
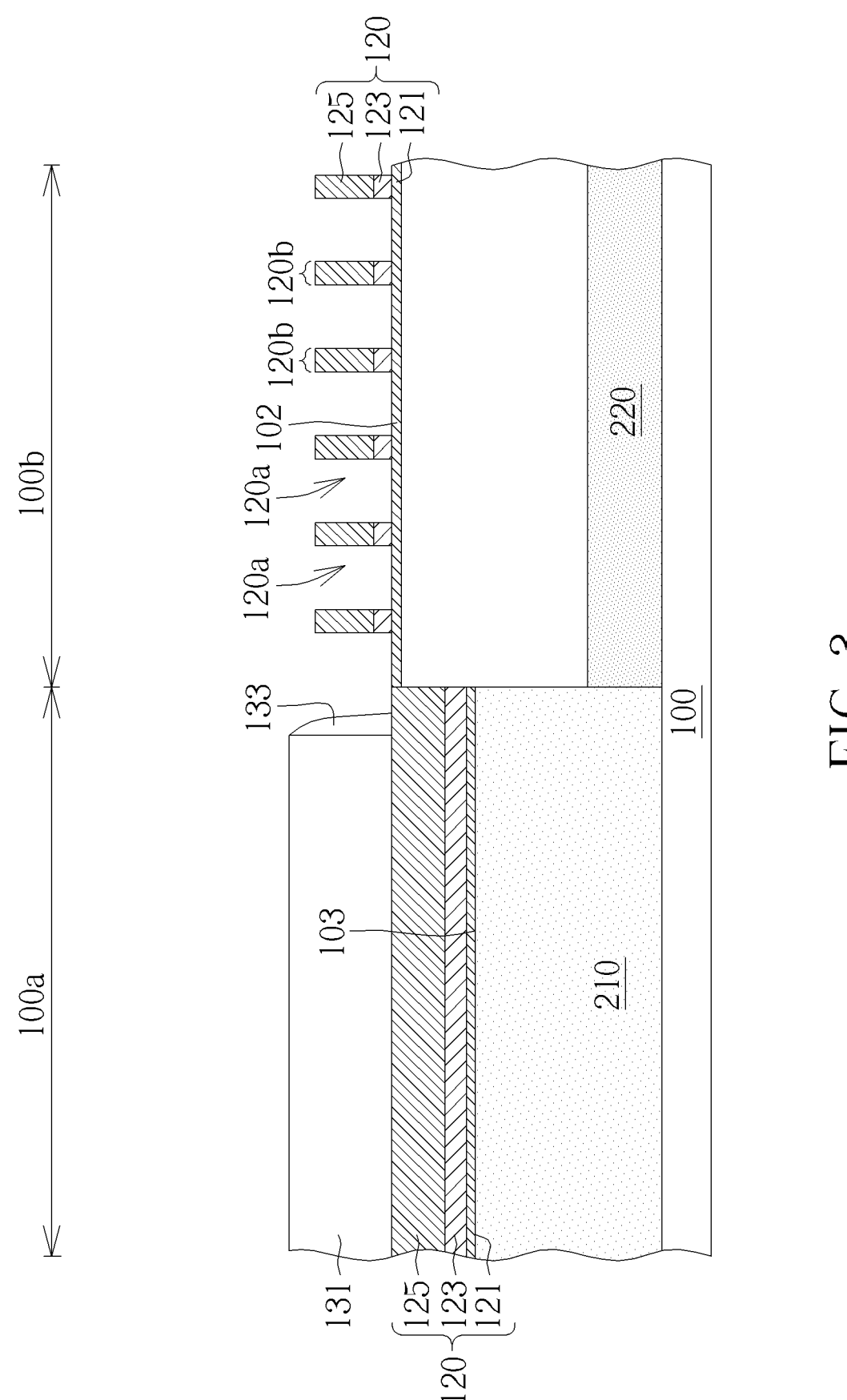

As shown in FIG. 2, after the mask structure 110 is removed, an etching process is optionally performed to completely remove the oxide layer 101*a*, so that the bulk substrate 100 has a relatively low surface 103 in the first region 100*a*. In other words, by removing the oxide layer 101*a*, there is a significant height difference H1 of the bulk substrate 100 between the topmost surface 103 in the first region 100*a* and the topmost surface 102 in the second region 100*b*, for example, about 300 angstroms to about 500 angstroms, but not limited thereto. Then, as shown in FIG. 3 to FIG. 4, multiple fin-shaped structures 224 are formed in the second region 100*b* of the bulk substrate 100 through a self-aligned double patterning (SADP) process or a self-aligned reverse patterning (SARP) process.

In detail, the method of forming the fin-shaped structures 224 includes, but is not limited to, the following steps. First, a mask structure 120 is formed on the bulk substrate 100 to cover the topmost surface 103 in the first region 100*a* and the topmost surface 102 in the second region 100*b* overall. Then, a sacrificial layer 131 is formed in the first region 100*a* to cover the first region 100*a* overall, and multiple patterned sacrificial layers (not shown) are formed in the second region 100*b* and on the mask structure 120 through photolithography and etching processes. The mask structure 120 includes, for example, a first mask layer 121 (for example, including silicon oxide), a second mask layer 123 (for example, including silicon nitride), and a third mask layer 125 (for example, including silicon oxide) stacked from bottom to top in sequence, but not limited thereto. Then, deposition and etching processes are sequentially performed to form sidewall spacers 133 on the sidewalls of the sacrificial layer 131, and to form sidewall spacers (not shown) on the sidewalls of each patterned sacrificial layer. Subsequently, a mask layer (not shown) is formed to cover the sacrificial layer 131 and the sidewall spacers 133 in the first region 100*a*, and the patterned sacrificial layers in the second region 100*b* are removed through the mask layer. Then, another etching process is performed through the sidewall spacers in the second region 100*b*, so that the pattern of the sidewall spacers is transferred to the underlying mask structure 120 to form multiple openings 120*a* penetrating through the third mask layer 125 and the second mask layer 123, and multiple mask patterns 120*b* are defined at the same time, as shown in FIG. 3. In addition, after the mask patterns 120*b* are formed, the mask layer maybe completely removed to expose the patterned sacrificial layers 131 and the sidewall spacers 133 in the first region 100*a*.

Figure 4:
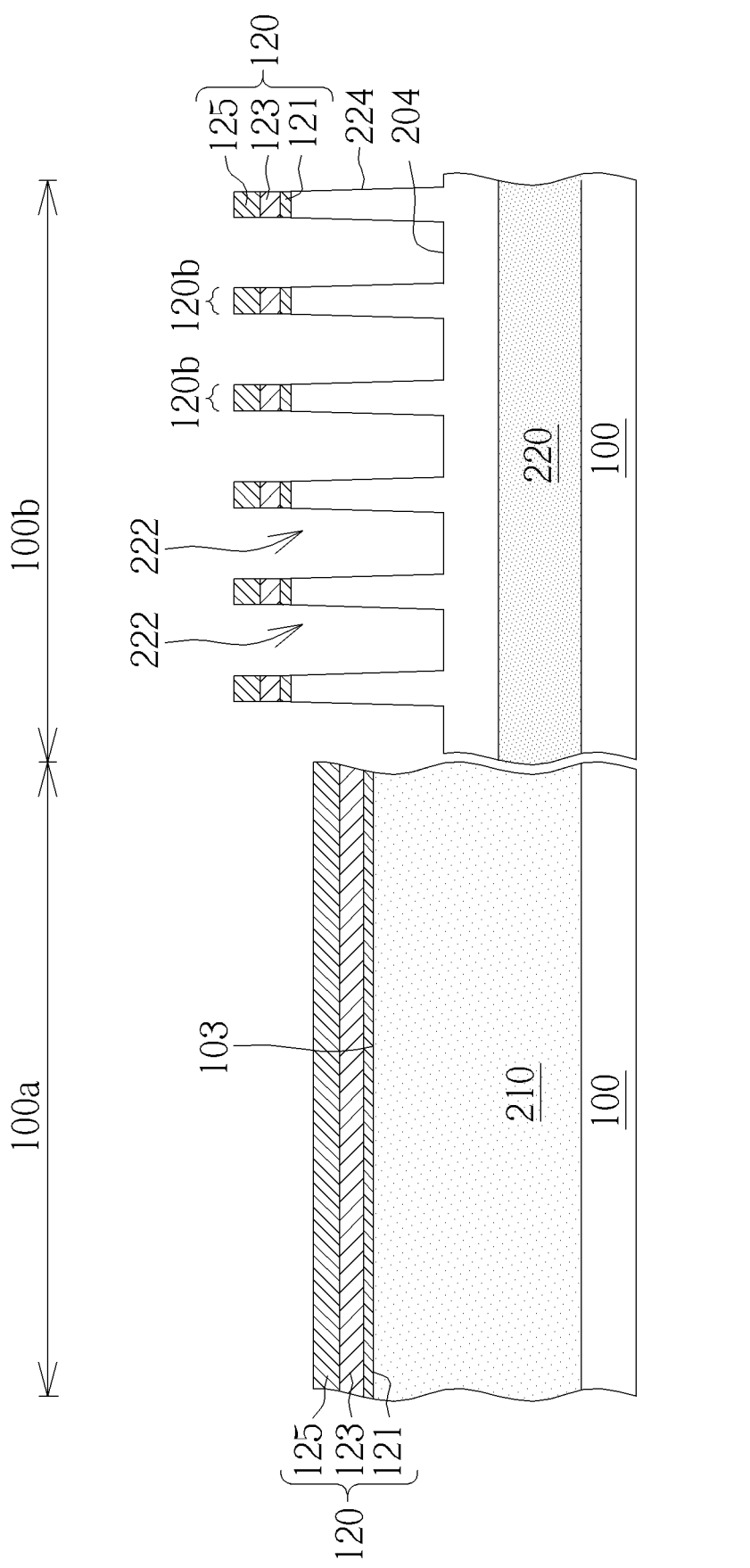

As shown in FIG. 4, another etching process is performed to transfer the pattern of the mask pattern 120*b* in the second region 100*b* to the underlying substrate 200 to form multiple shallow trenches 222 in the second region 100*b*. Meanwhile, multiple fin-shaped structures 224 and the plane 204 between the fin-shaped structures 224 are defined. Moreover, during the another etching process, the patterned sacrificial layers 131 and the sidewall spacers 133 in the first region 100*a* may be removed together, and the mask structure 120 in the first region 100*a* has not been etched, and still completely covers the bulk substrate 100, as shown in FIG. 4. In one embodiment, before forming the fin-shaped structures 224, a doped region 210 and a doped region 220 are formed in the first region 100*a* and the second region 100*b* of the bulk substrate 100, respectively. The doped region 210, for example, extends downward from the topmost surface 103 in the first region 100*a* to the interior of the bulk substrate 100. The doped region 220 is completely embedded in the interior of the bulk substrate 100, and not exposed from the topmost surface 102 in the second region 100*b*, as shown in FIG. 3. It should be noted that the fin-shaped structures 224 and the plane 204 are both located above the doped region 220, and each fin-shaped structure 224 protrudes from the plane 204 and does not directly contact the underlying doped region 220, as shown in FIG. 4.

Figure 5:
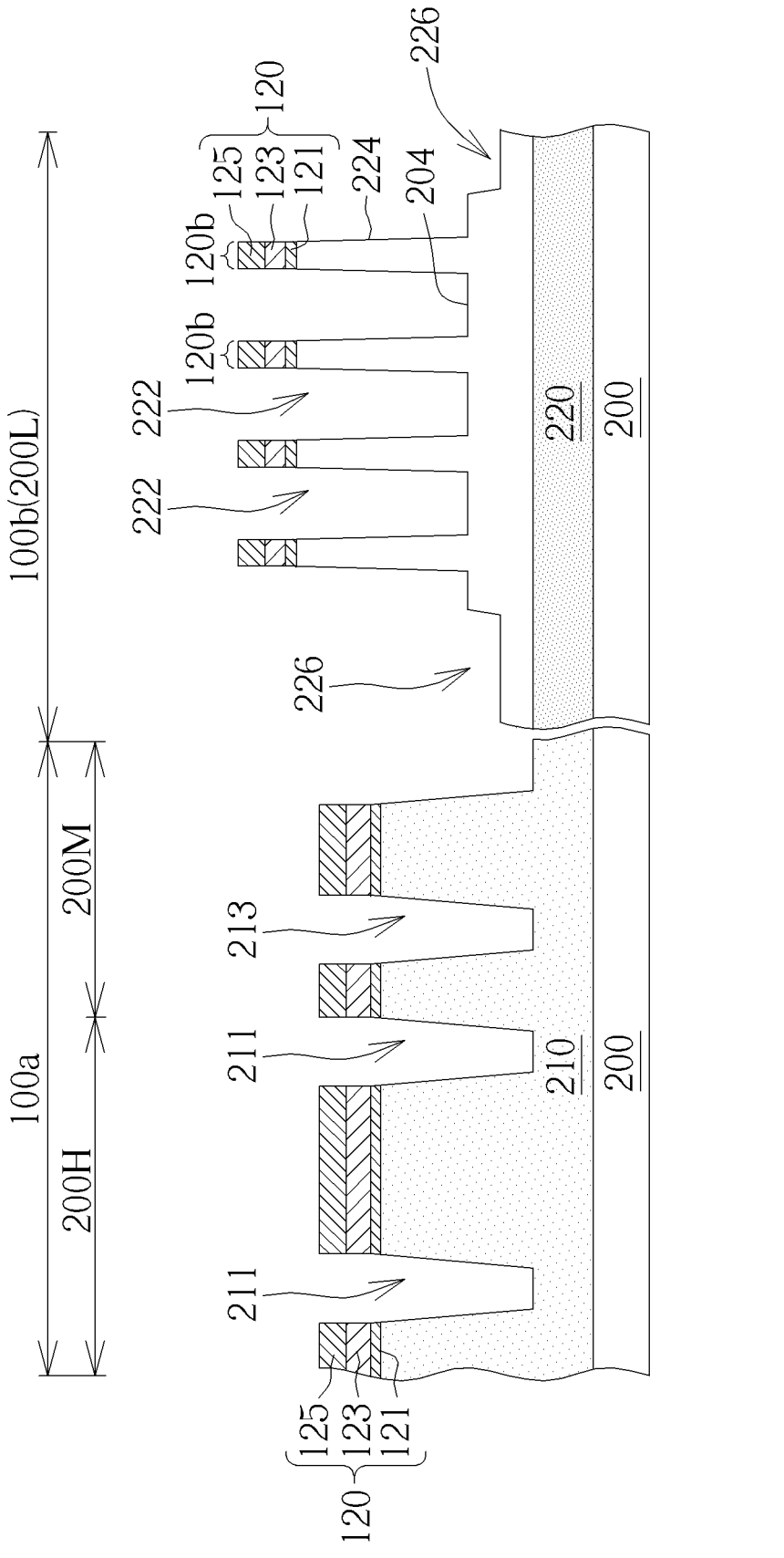

Afterwards, as shown in FIG. 5, a fin cut process is performed. Another mask layer (not shown) is formed on the bulk substrate 100, and an etching process is performed through this another mask layer to form multiple trenches 226 in the second region 100*b*, and to remove a portion of the fin-shaped structures 224 at the same time. In addition, multiple trenches 211, 213 are formed in the first region 100*a* at the same time, which pass through the mask structure 120 and a portion of the bulk substrate 100 to form a substrate 200, as shown in FIG. 5. Under this arrangement, the second region 100*b* maybe used as a low-voltage area 200L of the substrate 200 for forming low-voltage components, such as semiconductor transistors suitable for low-voltage operation. Moreover, the first region 100*a* may be further divided into a high-voltage area 200H and a medium-voltage area 200M of the substrate 200 for forming high-voltage components and medium-voltage components, respectively. The high-voltage area 200H, the medium-voltage area 200M, and the low-voltage area 200L may be areas for transistors with the same conductivity type or different conductivity types, for example, are respectively a PMOS transistor area and/or an NMOS transistor area, but not limited thereto. It should be noted that the trenches 211 are formed in the high-voltage area 200H and the trench 213 is formed in the medium-voltage area 200M.

Figure 6:
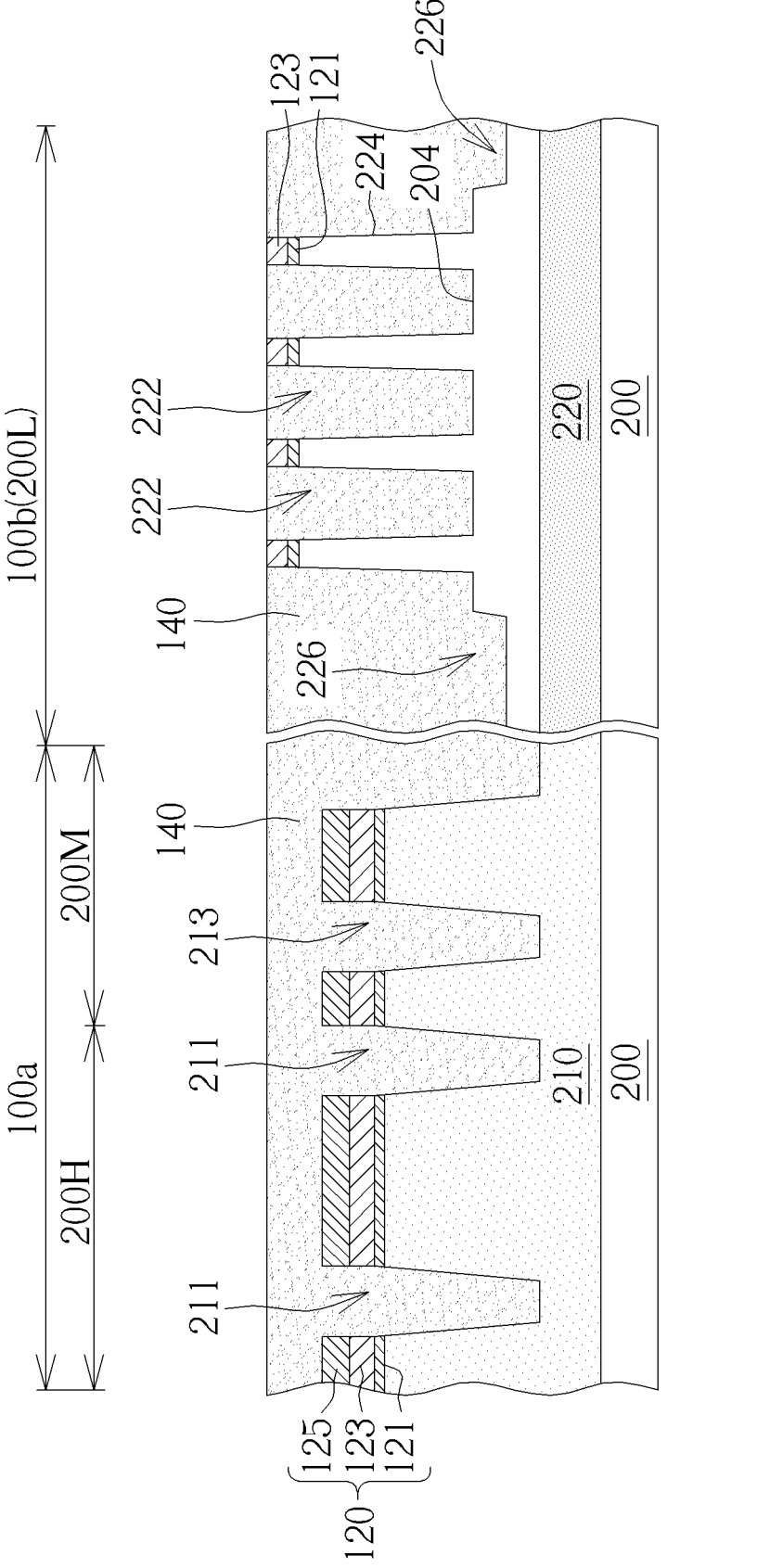

As shown in FIG. 6, deposition and chemical mechanical polishing/planarization (CMP) processes are sequentially performed to form a dielectric layer 140 to fill up the trenches 211, 213 in the first region 100*a* (i.e., the high-voltage area 200H and the medium-voltage area 200M) and the trenches 226, 222 in the second region 100*b* (i.e., the low-voltage area 200L). The method of forming the dielectric layer 140 includes, but is not limited to, the following steps. First, a dielectric material (not shown) is deposited to completely cover the mask structure 120 in the first region 100*a* (i.e., the high-voltage area 200H and the medium-voltage area 200M) and the second region 100*b* (i.e., the low-voltage area 200L). Then, the second mask layer 123 in the second region 100*b* (i.e., the low-voltage area 200L) is used as an etch stop layer to partially remove the dielectric material and the third mask layer 125 in the second region 100*b*, so that the top surface of the dielectric layer 140 is coplanar with the top surface of the second mask layer 123 in the second region 100*b* (i.e., the low-voltage area 200L), and is higher than the top surface of the mask structure 120 in the first region 100*a* (i.e., the high-voltage area 200H and the medium-voltage area 200M), as shown in FIG. 6. In other words, the dielectric layer 140 may completely cover the mask structure 120 in the first region 100*a* (i.e., the high-voltage area 200H and the medium-voltage area 200M), but only partially covers the second mask layer 123 in the second region 100*b* (i.e., the low-voltage area 200L).

Figure 7:
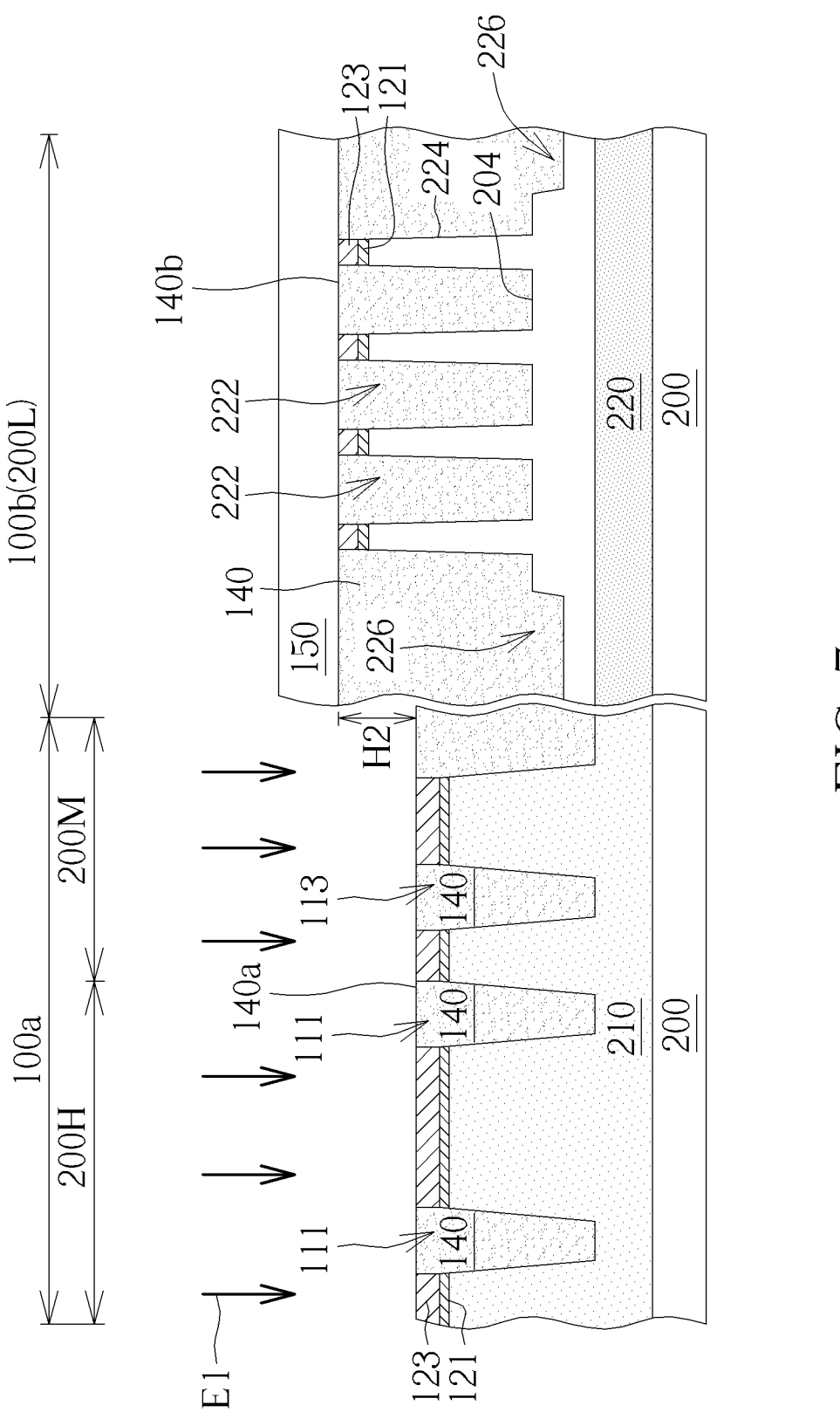

As shown in FIG. 7, a mask layer 150 is formed on the substrate 200 to cover the second region 100*b* (i.e., the low-voltage area 200L), and an etching process E1 is performed to partially remove the mask structure 120 and the dielectric layer 140 in the first region 100*a* (i.e., the high-voltage area 200H and the medium-voltage area 200M) through the mask layer 150, where the third mask layer 125 in the first region 100*a* (i.e., the high-voltage area 200H and the medium-voltage area 200M) is removed. After this process step, the top surface of the dielectric layer 140 in the first region 100a (i.e., the high-voltage area 200H and the medium-voltage area 200M) is coplanar with the top surface of the second mask layer 123 in the first region 100a, and the top surface of the dielectric layer 140 in the second region 100b (i.e., the low-voltage area 200L) is also coplanar with the top surface of the second mask layer 123 in the second region 100b. Meanwhile, the top surface 140a of the dielectric layer 140 in the first region 100a (i.e., the high-voltage area 200H and the medium-voltage area 200M) and the top surface 140b of the dielectric layer 140 in the second region 100b (i.e., the low-voltage area 200L) have a significant height difference H2, as shown in FIG. 7.

Figure 8:
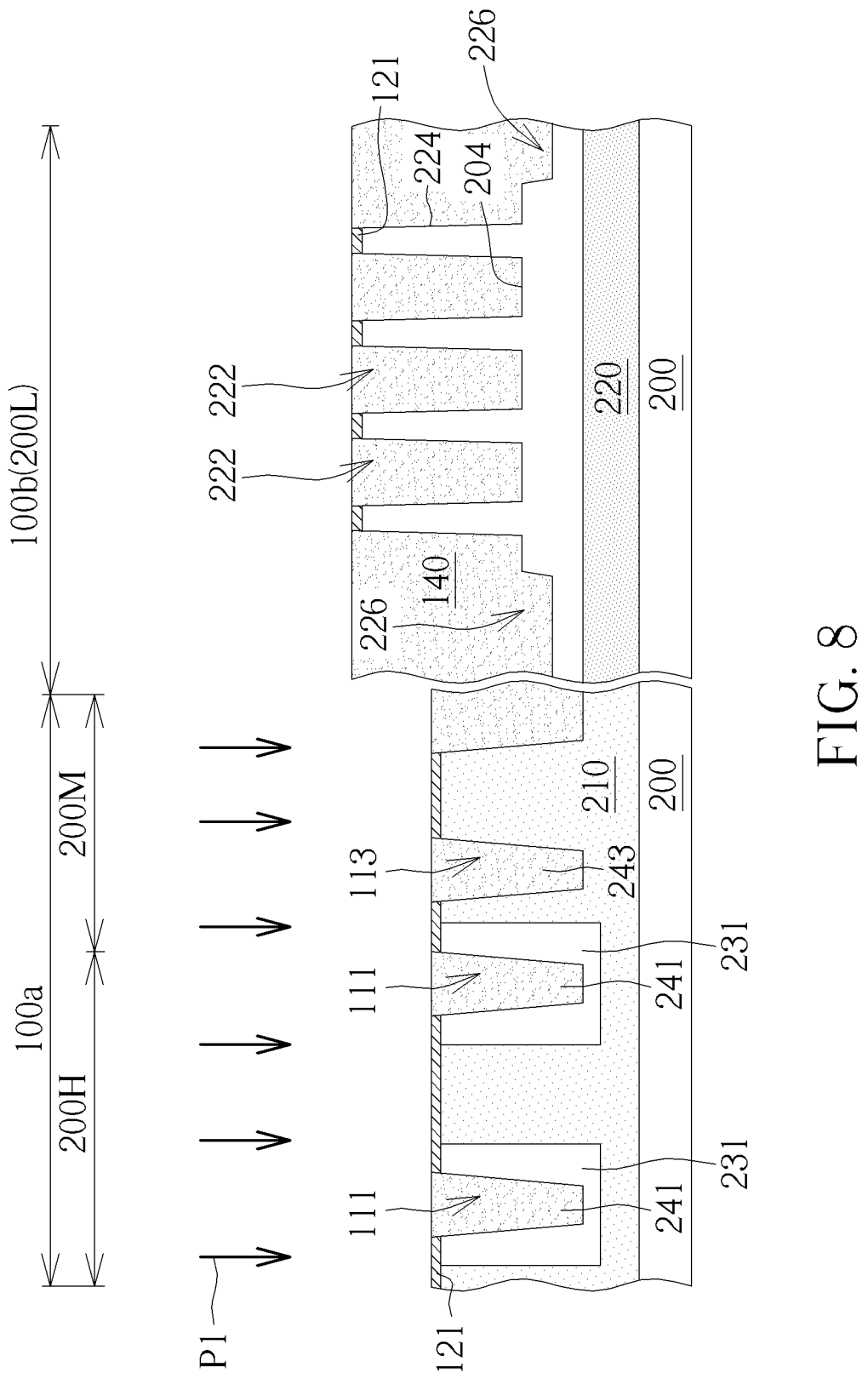

As shown in FIG. 8, the second mask layer 123 in the first region 100a (i.e., the high-voltage area 200H and the medium-voltage area 200M) and the second mask layer 123 in the second region 100b (i.e., the low-voltage area 200L) are simultaneously removed to expose the underlying first mask layer 121. Meanwhile, the dielectric layer 140 in the first region 100a (i.e., the high-voltage area 200H and the medium-voltage area 200M) and the dielectric layer 140 in the second region 100b (i.e., the low-voltage area 200L) are also partially removed simultaneously, so that shallow trench isolation structures 241 and 243 filling up the trenches 211 and 213 in the high-voltage area 200H and the medium-voltage area 200M, respectively, are formed as shown in FIG. 8. Then, in a preferred embodiment, an ion implantation process P1 is performed in the high-voltage area 200H while covered by the first mask layer 121 to form two doped regions 231. It should be noted that the doped regions 231 are formed in the doped region 210 and surround around the shallow trench isolation structures 241, as shown in FIG. 8.

Figure 9:
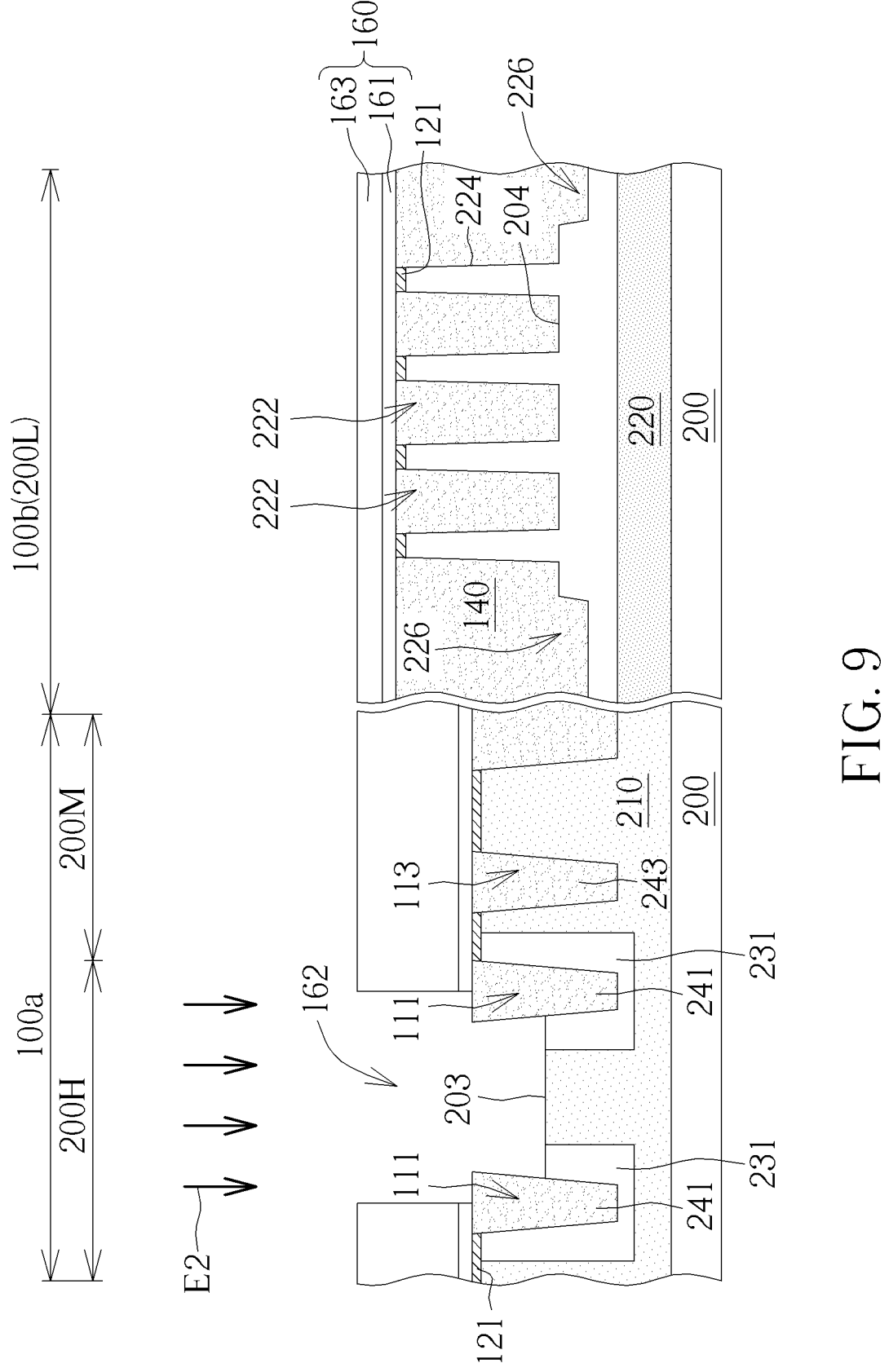
Figure 10:
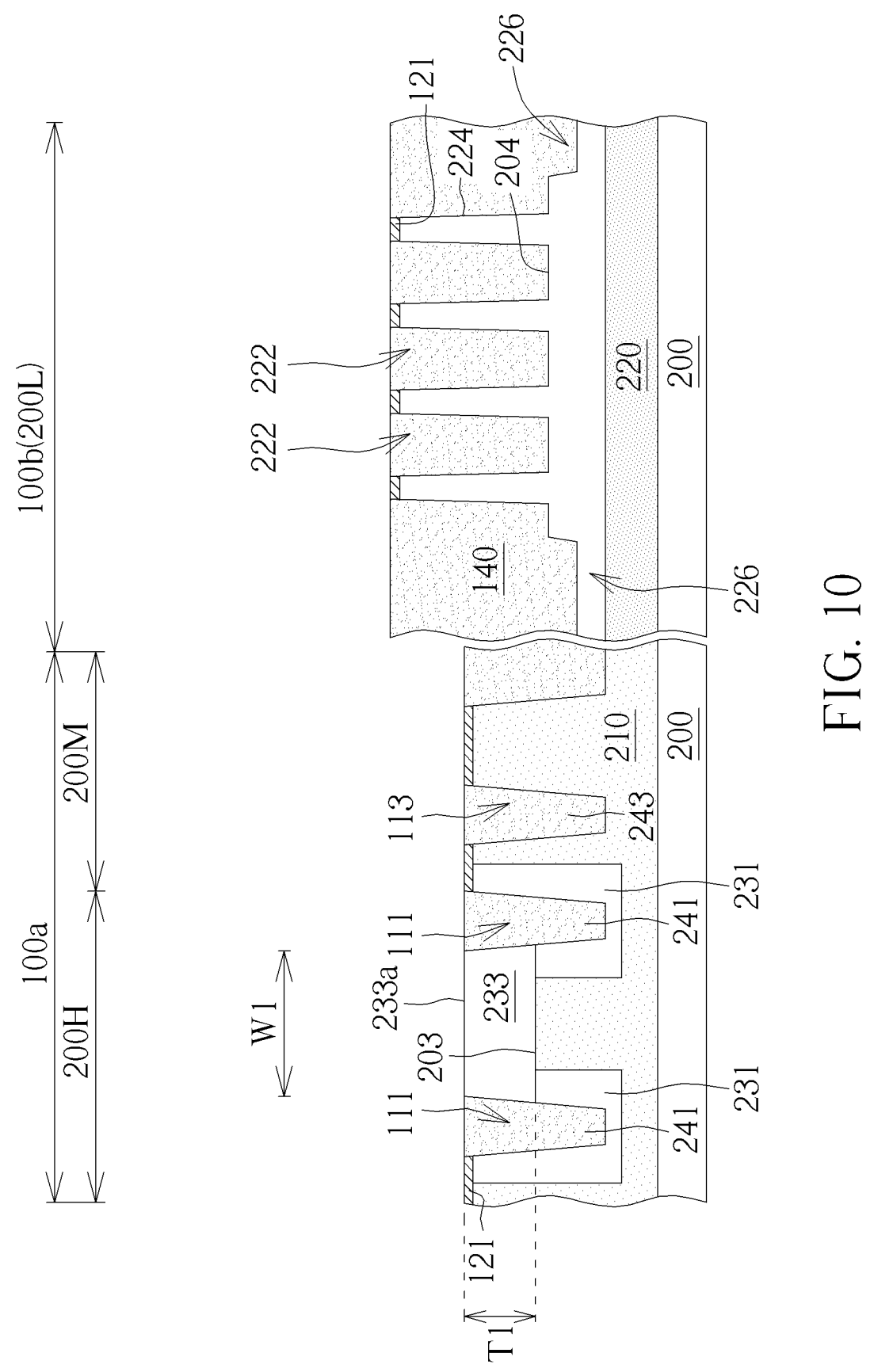

As shown in FIG. 9 to FIG. 10, a gate dielectric layer 233 is formed in the high-voltage area 200H. First, a mask structure 160 is formed on the substrate 200 to cover a portion of the first region 100a (i.e., the high-voltage area 200H and the medium-voltage area 200M) and the second region 100b (i.e., the low-voltage area 200L). The mask structure 160 includes, for example, a first mask layer 161 (including silicon nitride) and a second mask layer 163 (including photoresist material) that are stacked from bottom to top in sequence, but not limited thereto. It should be noted that the mask structure 160 has an opening 162 to partially expose the substrate 200 (including the first doped region 210 and the third doped regions 231) and the shallow trench isolation structures 241 in the high-voltage area 200H. Then, an etching process E2 is performed to partially remove the exposed substrate 200 (including the doped region 210 and the doped regions 231) through the mask structure 160 to form a plane 203 that is located between two adjacent shallow trench isolation structures 241, as shown in FIG. 9. Afterwards, an oxidation process or a deposition process is performed on the plane 203 to form a gate dielectric layer 233, as shown in FIG. 10. It should be noted that the gate dielectric layer 233 has a relatively large thickness T1, for example, about 700 angstroms to about 800 angstroms. Therefore, the topmost surface 233a of the gate dielectric layer 233 may be coplanar with the top surfaces of the shallow trench isolation structures 241, 243, but not limited thereto. In addition, the gate dielectric layer 233 may also have a relatively large width W1, for example, about 50 micrometers, and may contact the underlying doped region 210 and the underlying doped regions 231.

Figure 11:
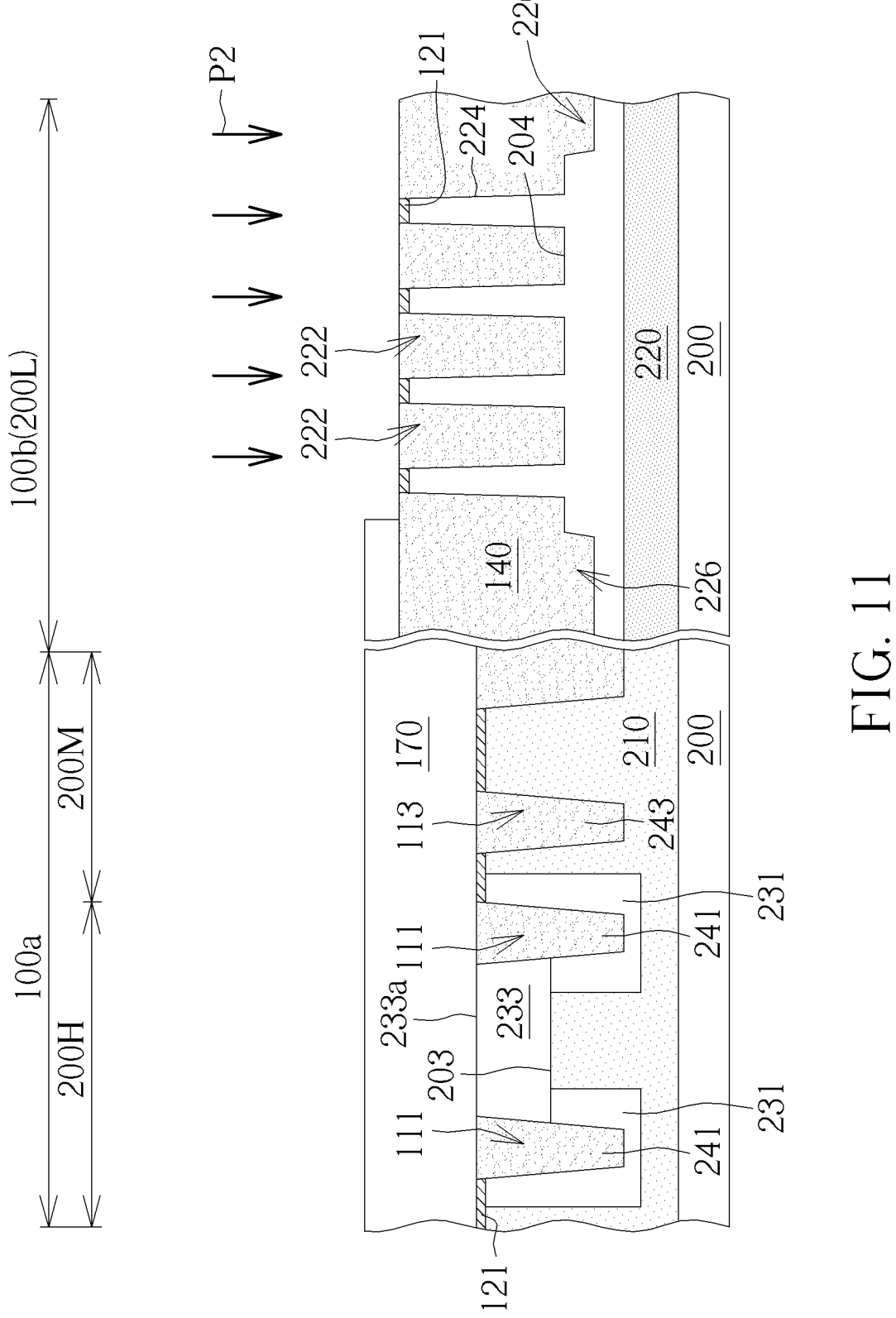

As shown in FIG. 11, after the mask structure 160 is completely removed, a mask layer 170 (for example, including a photoresist material) is formed on the substrate 200 to cover the first region 100a (i.e., the high-voltage area 200H and the medium-voltage area 200M) and a portion of the second region 100b (i.e., the low-voltage area 200L) to expose a portion of the low-voltage area 200L. Therefore, the first mask layer 121 and the dielectric layer 140 in the second region 100b (i.e., the low-voltage area 200L) are exposed from the mask layer 170. Then, an ion implantation process P2 is performed in the low-voltage area 200L through the mask layer 170 to form multiple doped regions (not shown) in the fin-shaped structures 224 under the first mask layer 121. The doped regions may be used as source/drain regions of subsequently formed transistors.

Figure 12:
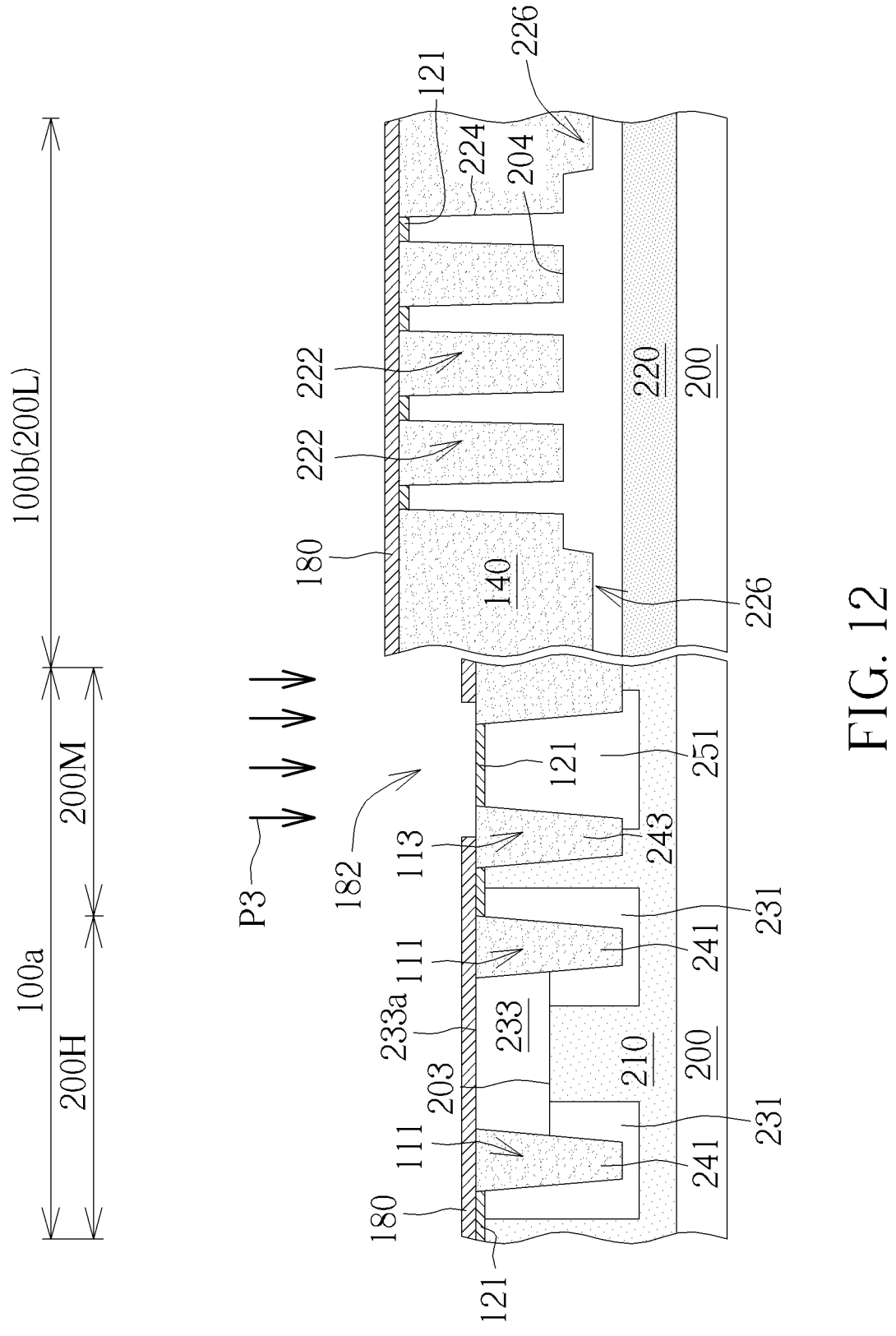
Figure 13:
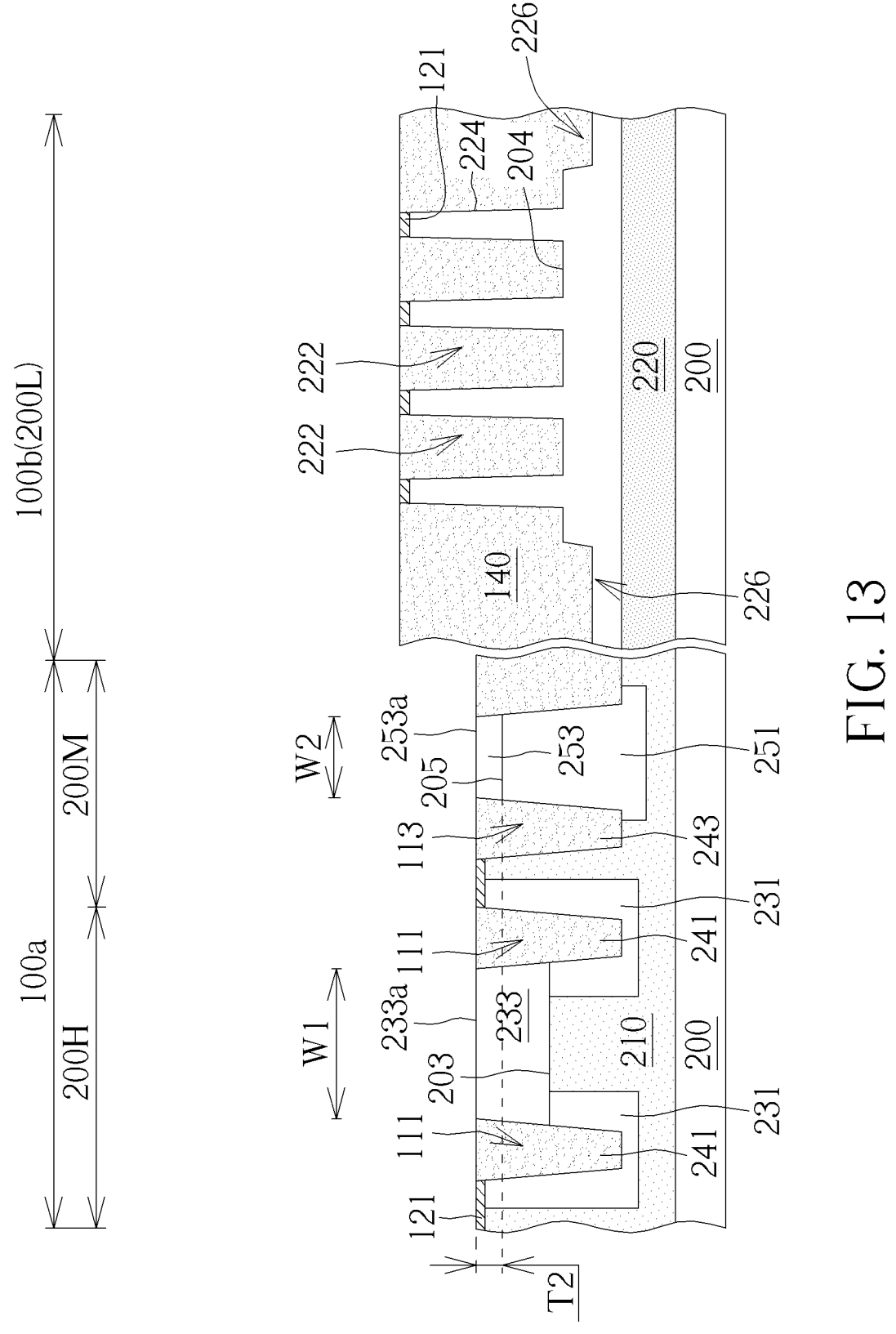

Next, as shown in FIG. 12 to FIG. 13, a gate dielectric layer 253 is formed in the medium-voltage area 200M. First, after the mask layer 170 is completely removed, a mask layer 180 (for example, including silicon nitride) is formed on the substrate 200 to cover the second region 100b (i.e., the low-voltage area 200L) and the high-voltage area 200H. The mask layer 180 has an opening 182 corresponding to the medium-voltage area 200M of the substrate 200 to expose the first mask layer 121 and the shallow trench isolation structures 243 in the medium-voltage area 200M. An ion implantation process P3 is performed on the medium-voltage area 200M through the mask layer 180 to form a doped region 251 in the substrate 200, as shown in FIG. 12. Then, the first mask layer 121 in the medium-voltage area 200M is removed, and an oxidation process is performed through the mask layer 180 to form a gate dielectric layer 253 and define a plane 205, as shown in FIG. 13. The gate dielectric layer 253 is formed on the plane 205 and has a thickness T2, for example, about 200 angstroms, and a width W2, for example, about 10 micrometers, but not limited thereto. It should be noted that the top surface 253a of the gate dielectric layer 253 in the medium-voltage area 200M may be coplanar with the top surface 233a of the gate dielectric layer 233 in the high-voltage area 200H, as shown in FIG. 13.

Figure 14:
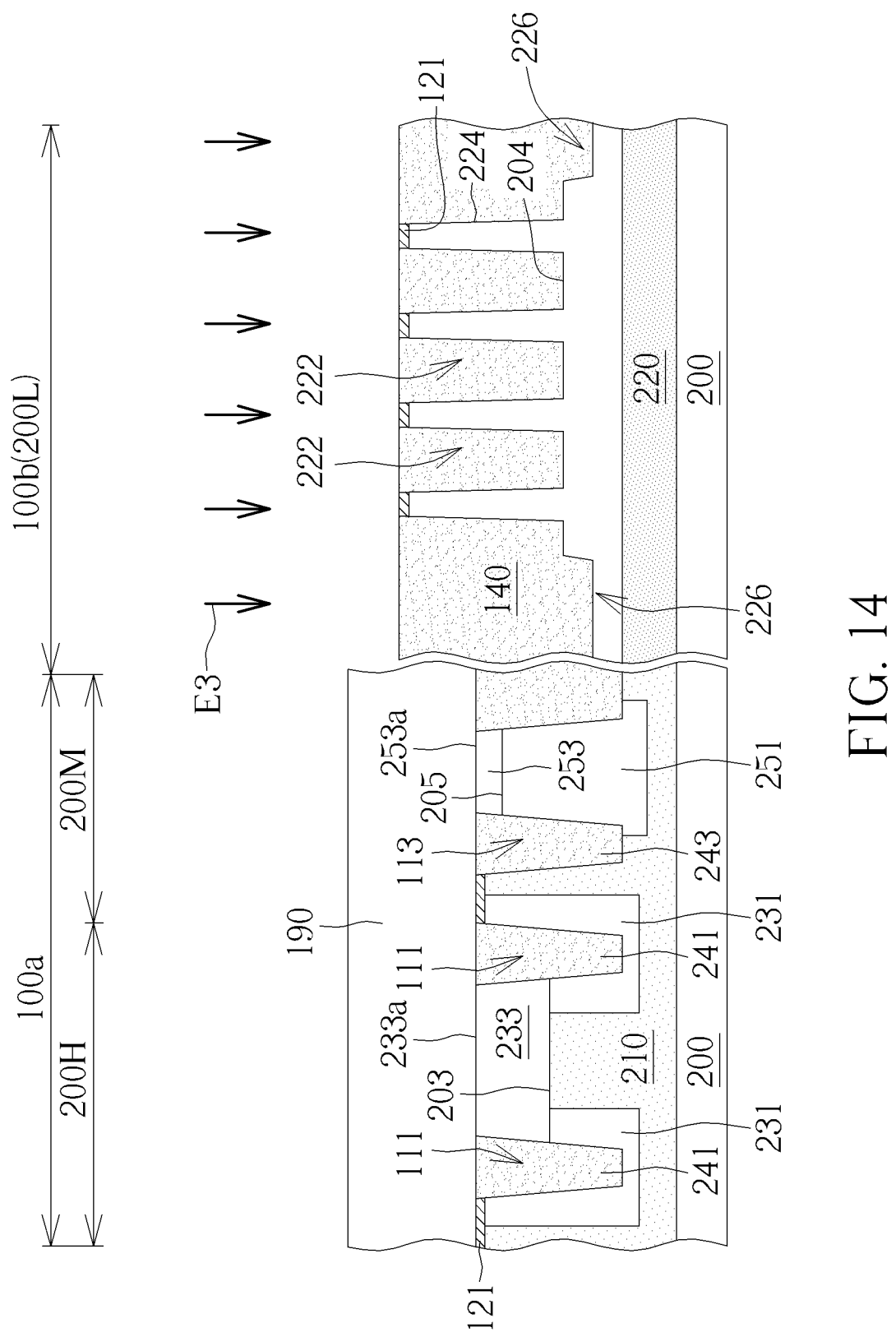
Figure 15:
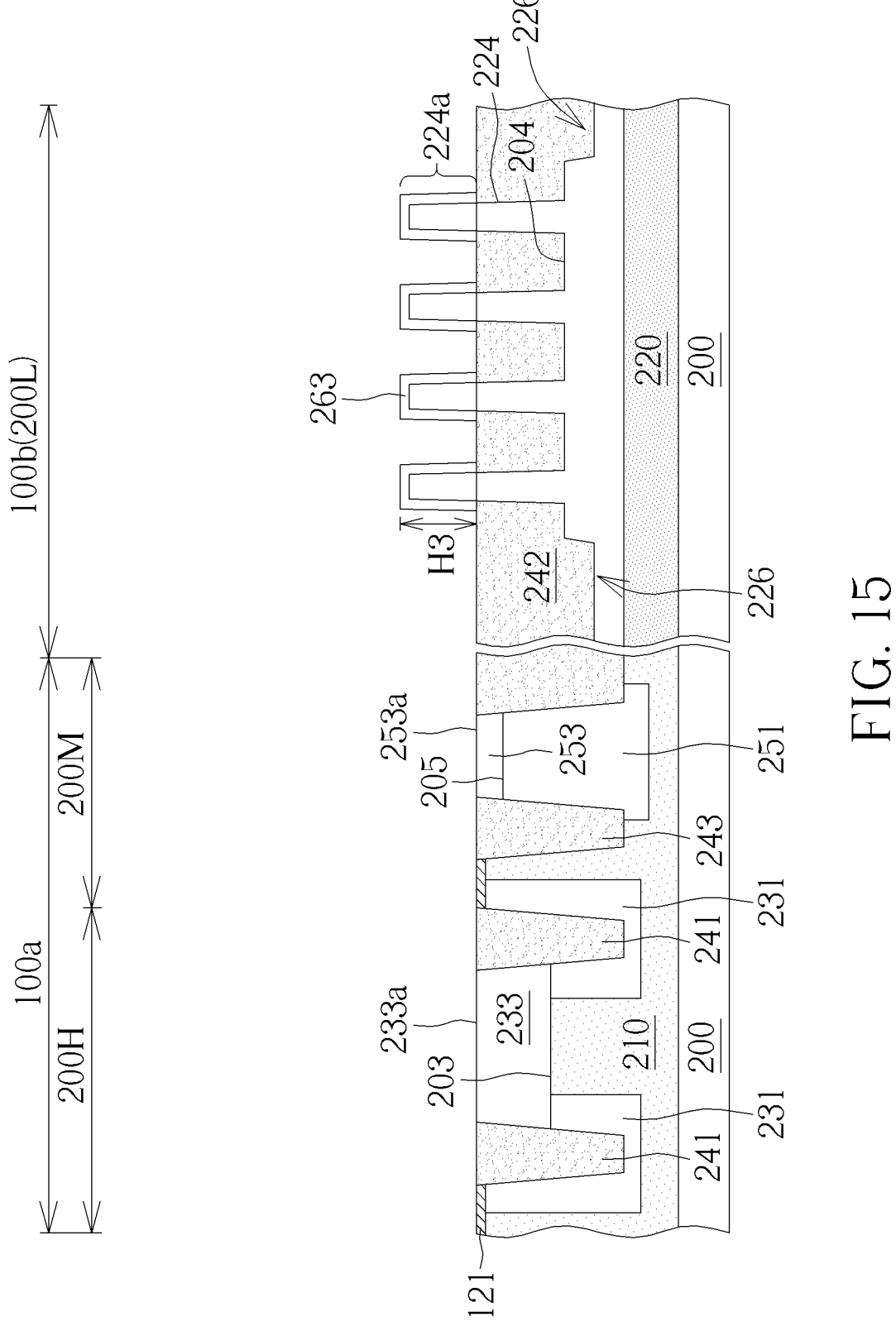

As shown in FIG. 14 to FIG. 15, a gate dielectric layer 263 is formed in the low-voltage area 200L. First, as shown in FIG. 14, after the mask layer 180 is removed, a mask layer 190 (for example, including a photoresist material) is formed on the substrate 200 to cover the first region 100a (i.e., the high-voltage area 200H and the medium-voltage area 200M) and to expose the second region 100b (i.e., the low-voltage area 200L). Under this arrangement, through the mask layer 190, an etching process E3 such as a SiCoNi etching process is performed to completely remove the first mask layer 121 in the second region 100b (i.e., the low-voltage area 200L), and to partially remove the dielectric layer 140 filling in the trenches 222 and 226. Therefore, the shallow trench isolation structures 242 in the low-voltage area 200L are formed through the etching process E3, and a fin portion 224a of each fin-shaped structure 224 protrudes from the surface of the shallow trench isolation structure 242 and is exposed, as shown in FIG. 15. In this embodiment, the fin portion 224a has a height H3, for example, about 300 angstroms to about 500 angstroms, preferably equal to the height difference H1 of the bulk substrate 100 between the first region 100a and the second region 100b, but not limited thereto. Under this arrangement, the bottom of the fin portion 224a may be coplanar with both the top surface 253a of the gate dielectric layer 253 in the medium-voltage area 200M and the top surface 233a of the gate dielectric layer 233 in the high-voltage area 200H, as shown in FIG. 15, but not limited to this. Then, another oxidation process is performed to forma gate dielectric layer 263 on the surface of the fin portion 224a of each fin-shaped structure 224.

Figure 16:
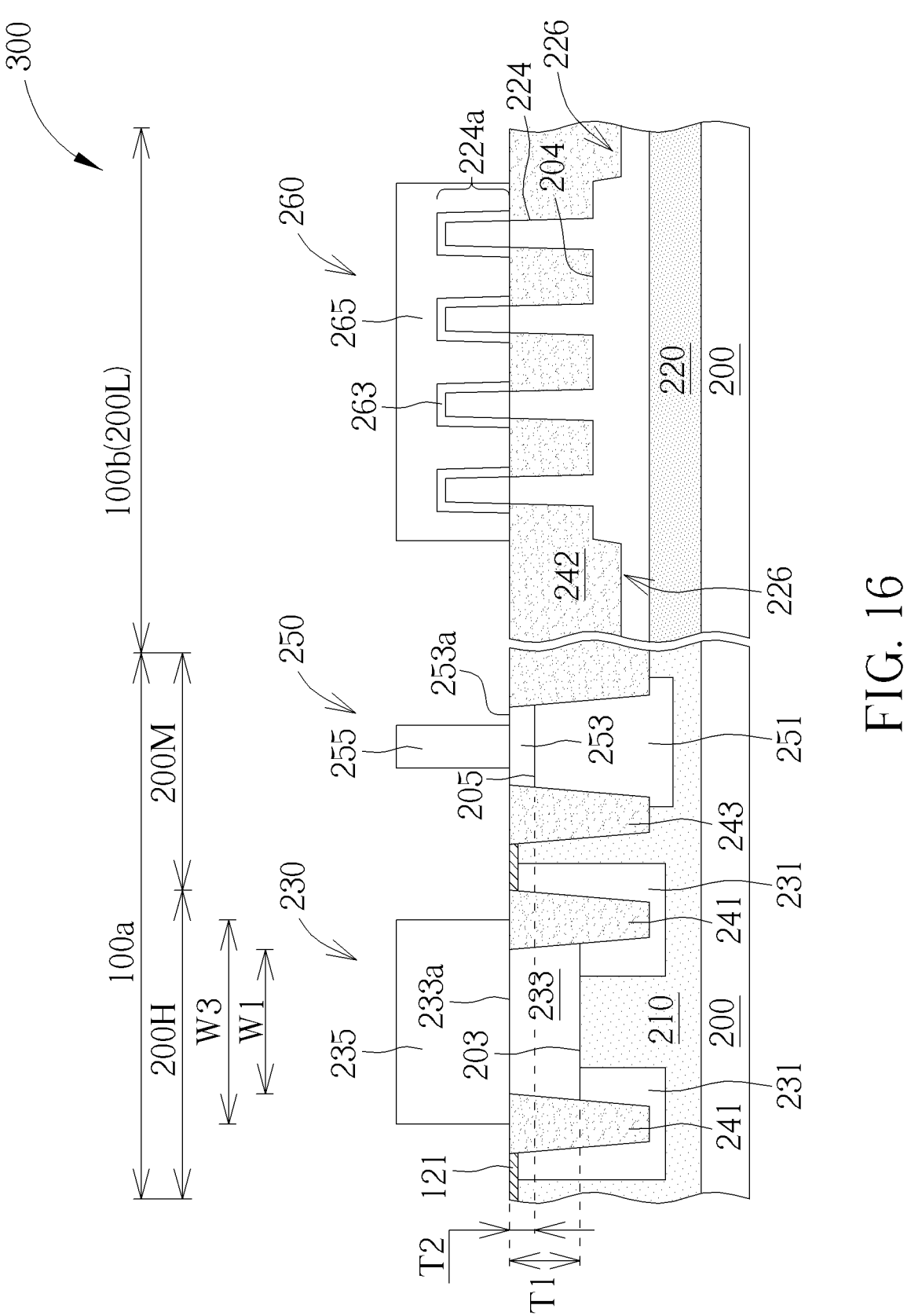

As shown in FIG. 16, deposition and patterning processes are sequentially performed to form gate electrodes 235, 255, and 265 on the substrate 200 respectively, so that a transistor 230, a transistor 250, and a transistor 260 are simultaneously formed in the high-voltage area 200H, the medium-voltage area 200M, and the low-voltage area 200L of the substrate 200, respectively, to complete a semiconductor device 300 of the first embodiment of the present disclosure. Where, the gate electrode 235 is formed on the gate dielectric layer 233, the gate electrode 255 is formed on the gate dielectric layer 253, and the gate electrode 265 is formed on the fin-shaped structures 224 and crossing the fin portions 224a.

In detail, the semiconductor device 300 includes the transistor 230 and the shallow trench isolation structures 241 disposed in the high-voltage area 200H, the transistor 250 and the shallow trench isolation structures 243 disposed in the medium-voltage area 200M, and the transistor 260 and the shallow trench isolation structures 242 disposed in the low-voltage area 200L. Where, the shallow trench isolation structures 241 disposed in the high-voltage area 200H, the shallow trench isolation structures 243 disposed in the medium-voltage area 200M, and the shallow trench isolation structures 242 disposed in the low-voltage area 200L may have the top surfaces coplanar with each other, and the same depth as each other.

The transistor 230 further includes the gate dielectric layer 233 disposed on the plane 203, and the gate electrode 235 disposed on the gate dielectric layer 233, where the gate electrode 235 has a relatively large width W3 to completely cover the underlying gate dielectric layer 233 (width W1), and partially crosses the shallow trench isolation structures 241 on two sides of the gate dielectric layer 233. In addition, the transistor 230 also includes the doped regions 231, which are used as the source/drain regions of the transistor 230 and are isolated from the gate structure (i.e., the gate dielectric layer 233 and the gate electrode 235) of the transistor 230 through the shallow trench isolation structures 241. In addition, the transistor 250 further includes the gate dielectric layer 253 disposed on the plane 205, and the gate electrode 255 disposed on the gate dielectric layer 253, where two sides of the transistor 250 are isolated from the adjacent high-voltage area 200H and the adjacent low-voltage area 200L through the shallow trench isolation structures 243. The transistor 260 further includes the gate dielectric layer 263 disposed above the fin-shaped structures 224 and the gate electrode 265, where the fin-shaped structures 224 protrude from the plane 204 of the substrate 200. Although the source/drain regions of the transistor 260 are not specifically shown in the drawings of this embodiment, those skilled in the art should easily understand that the source/drain regions are located in the fin-shaped structures 224 and on two opposite sides of the gate electrode 265 while viewed in a top view.

In addition, the gate dielectric layer 233 of the transistor 230 in the high-voltage area 200H and the gate dielectric layer 253 of the transistor 250 in the medium-voltage area 200M both have relatively large thicknesses T1 and T2, so as to withstand relatively high withstand voltages, and are used as a high-voltage component and a medium-voltage component of the semiconductor device 300, respectively. It should be noted that although the thickness T1 is greater than the thickness T2, the plane 205 is higher than the plane 203, so that the top surface 233a of the gate dielectric layer 233 and the top surface 253a of the gate dielectric layer 253 may still be coplanar with each other. In other words, the gate dielectric layer 233 of the transistor 230 and the gate dielectric layer 253 of the transistor 250 both are partially buried in the shallow trench isolation structures 241 and 243, so that the top surface 233a of the gate dielectric layer 233 and the top surface 253a of the gate dielectric layer 253 may be coplanar with the top surfaces of the shallow trench isolation structures 241, 243. Moreover, since the plane 203 and the plane 205 both are higher than the disposed plane 204 of the fin-shaped structures 224, the topmost surface of the gate electrode 235 in the high-voltage area 200H and the topmost surface of the gate electrode 255 in the medium-voltage area 200M may also be coplanar with the topmost surface of the gate electrode 265 crossing the top of the fin-shaped structures 224, as shown in FIG. 16.

The fabrication method of this embodiment is to embed a portion of the transistor 230 in the high-voltage area 200H and a portion of the transistor 250 in the medium-voltage area 200M (i.e., the gate dielectric layers 233, 253) in the substrate 200, thereby being coplanar with the bottom of the fin portion 224a of the transistor 260 in the low-voltage area 200L. Therefore, it avoids the relatively large thicknesses T1 and T2 of the gate dielectric layers 233, 253 to produce significant height differences between different regions of the substrate 200, especially the height differences of the gate electrodes 235, 255, 265 in different regions. Under this arrangement, the fabrication method of this embodiment avoids the load effect induced by the height difference between the gates, and the process impact on the chemical mechanical polishing process or the replacement of metal gate (RMG) process by the height difference between the gates. Therefore, the fabrication method of this embodiment integrates the processes of forming high-voltage components, medium-voltage components, and low-voltage components together, thereby forming the semiconductor device 300 having high-voltage components, medium-voltage components, and low-voltage components under the premise of simplified processes. In addition, the semiconductor device 300 formed by the fabrication method of this embodiment includes the transistors 230, 250, 260 and the shallow trench isolation structures 241, 243, 242 disposed in different regions, thereby being suitable for different voltage ranges. The transistor 230 disposed in the high-voltage area 200H, the transistor 250 disposed in the medium-voltage area 200M, and the transistor 260 disposed in the low-voltage area 200L may have the top surfaces coplanar with each other. The shallow trench isolation structures 241 disposed in the high-voltage area 200H, the shallow trench isolation structures 243 disposed in the medium-voltage area 200M, and the shallow trench isolation structures 242 disposed in the low-voltage area 200L may have the same depth as each other. Therefore, more optimized performances of the semiconductor device are achieved.

Those skilled in the art should easily understand that, under the premise of satisfying the actual product requirements, the semiconductor devices and the methods of fabricating the same of the present disclosure may also have other aspects, which are not limited to the aforementioned descriptions. The following will further describe other embodiments or variations of the semiconductor devices and the fabrication methods thereof. In order to simplify the description, the following description mainly focuses on the differences between the embodiments, and the similarities between the embodiments are not repeated. In addition, the same elements in the various embodiments of the present disclosure are labeled with the same reference numerals to facilitate comparison between the various embodiments.

According to other embodiments of the present disclosure, under the premise of the topmost surfaces of the gate electrodes being coplanar with each other, the thickness of the gate dielectric layer in the high-voltage area 200H may be further increased. In this way, the durability of the high-voltage components is improved to obtain better performance. Please refer to FIG. 17, which is a schematic cross-sectional view of a semiconductor device 400 of a second embodiment of the present disclosure. The structure of the semiconductor device 400 in this embodiment is substantially the same as that of the semiconductor device 300 in the aforementioned first embodiment, and also includes a substrate 200 (including a high-voltage area 200H, a medium-voltage area 200M, and a low-voltage area 200L), transistors 250, 260, and shallow trench isolation structures 241, 242, 243, etc., the same is not repeated here. The main difference between this embodiment and the previous embodiment is that a transistor 430 disposed in the high-voltage area 200H has a gate dielectric layer 433 with a relatively larger thickness T3.

Figure 17:
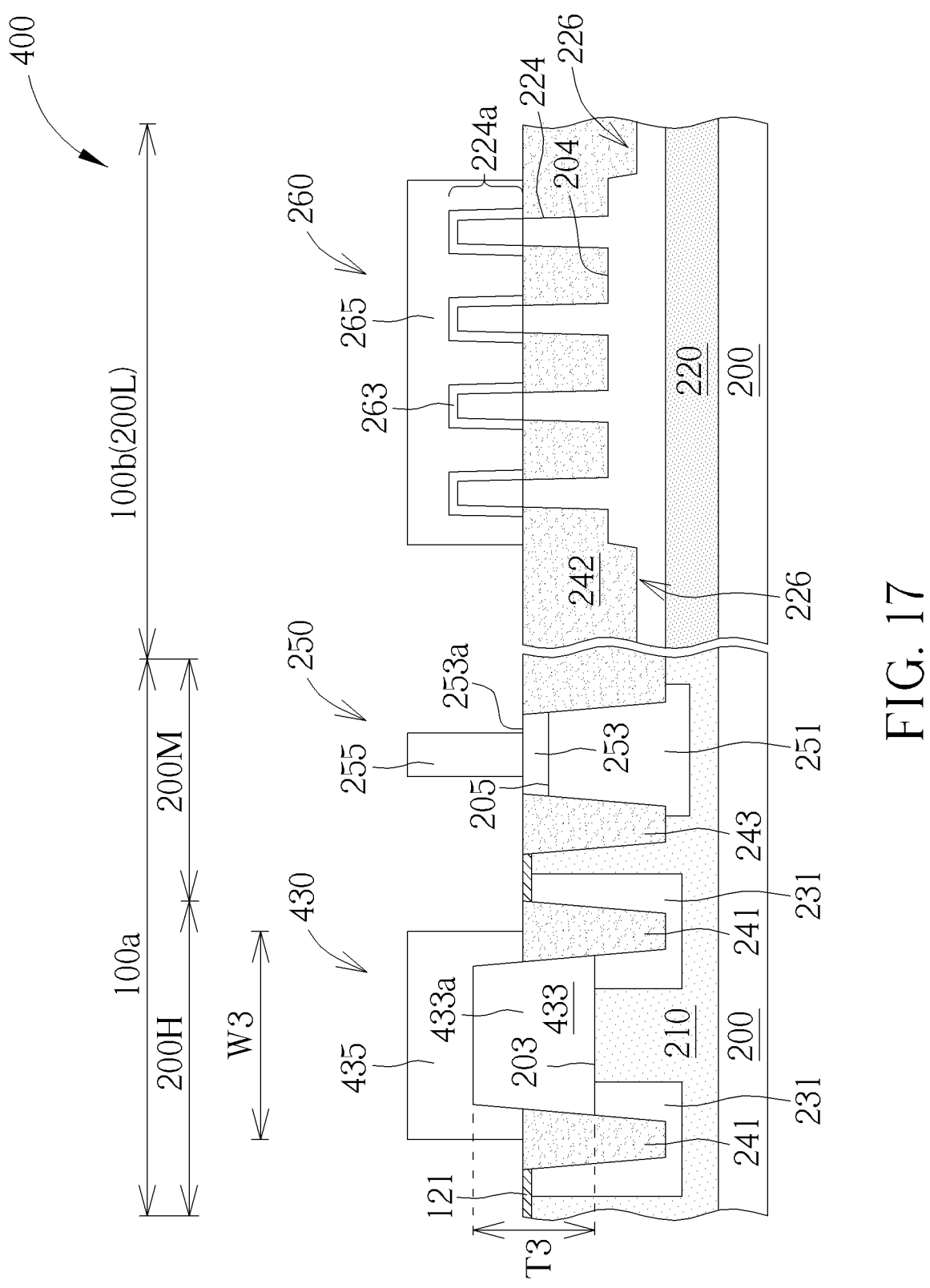
FIG. 17 is a schematic cross-sectional view of a semiconductor device according to a second embodiment of the present disclosure.

In detail, the transistor 430 further includes the gate dielectric layer 433 disposed on the plane 203, and a gate electrode 435 disposed on the gate dielectric layer 433, where a portion of the gate dielectric layer 433 (i.e., the upper half portion) protrudes from the substrate 200. Therefore, the top surface 433a of the gate dielectric layer 433 is higher than the top surface of the shallow trench isolation structure 431, as shown in FIG. 17. It should be noted that, in this embodiment, the top surface 433a of the gate dielectric layer 433 may be coplanar with the top surface of the fin portion 224a (i.e., the topmost surface of the fin-shaped structure 224) in the low-voltage area 200L, but not limited thereto. Under this arrangement, the subsequently formed gate electrode 435 may wrap around the outside of the portion of the gate dielectric layer 433 and have an inverted U-shape.

Therefore, the semiconductor device 400 of this embodiment also includes the transistor 430 and the shallow trench isolation structures 241 disposed in the high-voltage area 200H, the transistor 250 and the shallow trench isolation structures 243 disposed in the medium-voltage area 200M, and the transistor 260 and the shallow trench isolation structures 242 disposed in the low-voltage area 200L. The topmost surface of the gate electrode 435 in the high-voltage area 200H, the topmost surface of the gate electrode 255 in the medium-voltage area 200M, and the topmost surface of the gate electrode 265 in the low-voltage area 200L are also coplanar with each other to avoid problems such as load effect. Therefore, the semiconductor device 400 of the present embodiment is also formed under the premise of simplified process, and has good device performances.

Figure 18:
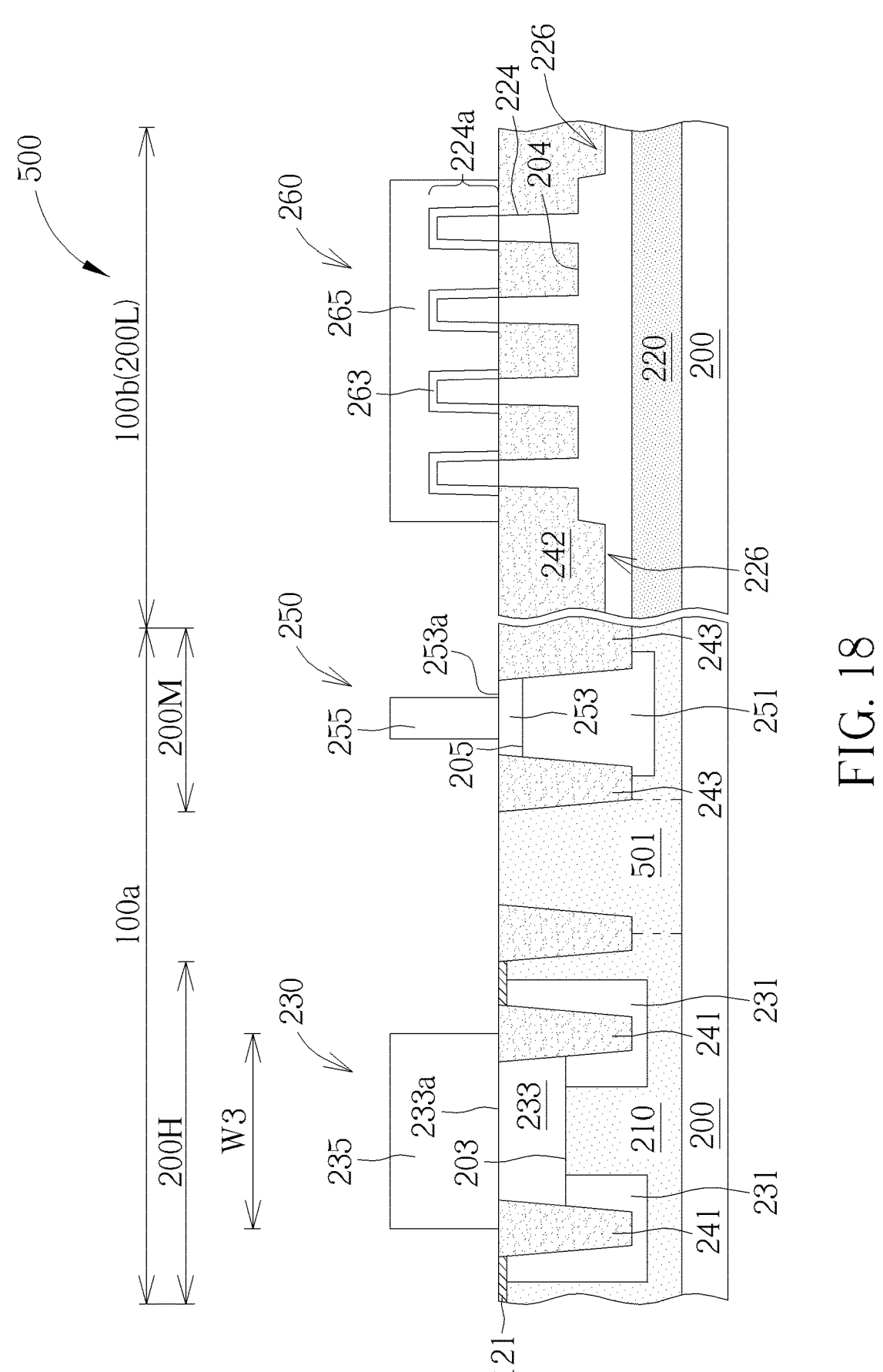
Figure 19:
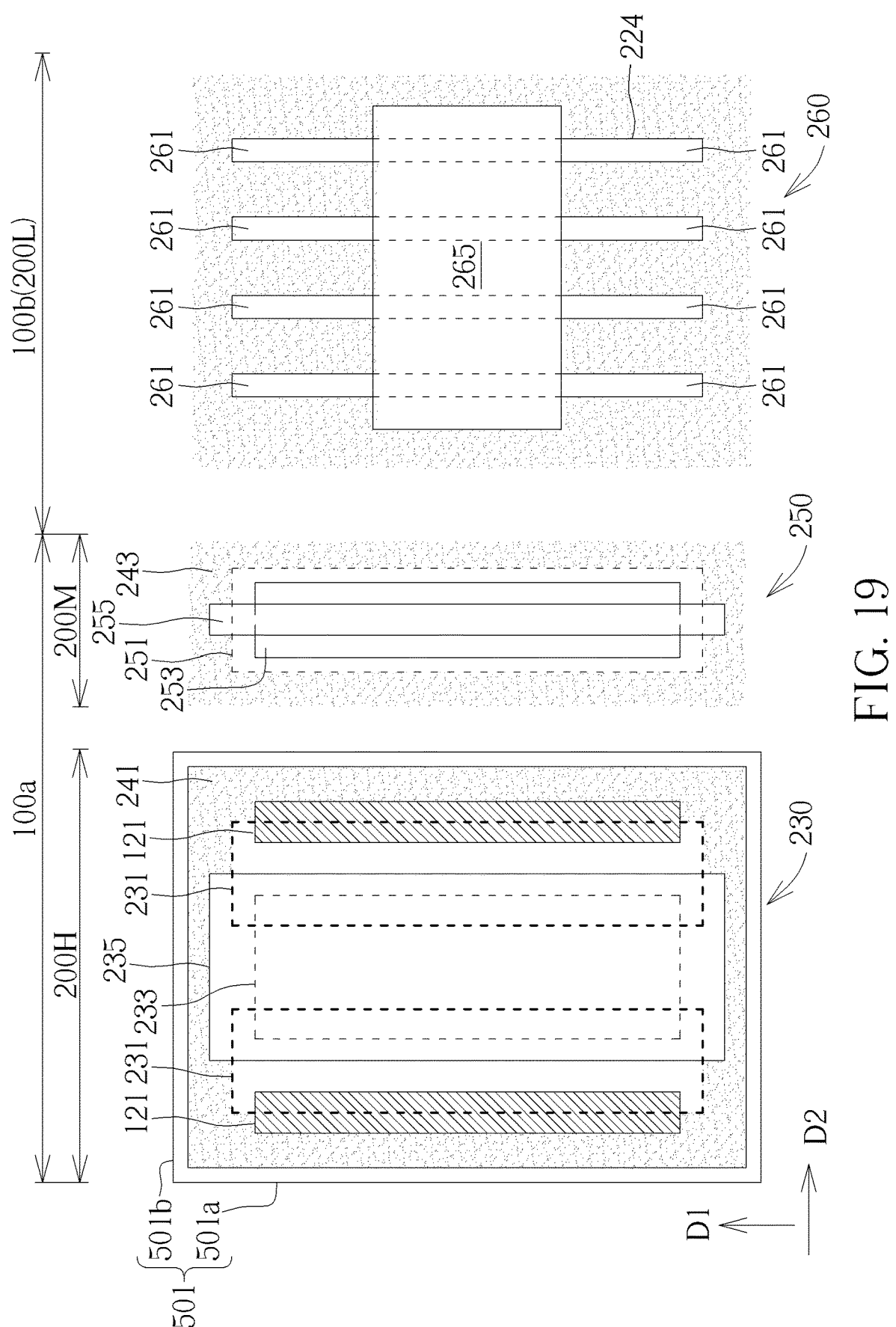

Please refer to FIG. 18 and FIG. 19, which are schematic diagrams of a semiconductor device 500 of a third embodiment of the present disclosure. The structure of the semiconductor device 500 in this embodiment is substantially the same as that of the semiconductor device 300 in the aforementioned first embodiment, and also includes a substrate 200 (including a high-voltage area 200H, a medium-voltage area 200M, and a low-voltage area 200L), transistors 230, 250, 260 and shallow trench isolation structures 241, 242, 243, etc., the same is not repeated here. The main difference between this embodiment and the previous embodiment is that a protective structure (pick-up) 501 is further disposed in the substrate 200 to surround the high-voltage area 200H and the transistor 230.

In detail, as shown in FIG. 18, the protective structure 501 includes, for example, a doped region located in the substrate 200 and between the high-voltage area 200H and the medium-voltage area 200M. The dopants of the doped region preferably have different conductivity type from that of the doped regions 231. The top surface of the protective structure 501 is, for example, coplanar with the top surface of the first mask layer 121 in the high-voltage area 200H, but not limited thereto. In addition, while viewed from the top view shown in FIG. 19, the protective structure 501 may include a first portion 501a extending in a first direction D1 and a second portion 501b extending in a second direction D2 to surround the high-voltage area 200H and transistor 230 as a whole. In this way, the first portion 501a of the protective structure 501 may be located between the high-voltage area 200H and the medium-voltage area 200M, and between the doped region 231 and the doped region 251.

In addition, as shown in FIG. 19, the transistor 230 is disposed in the high-voltage area 200H, and includes two doped regions 231, a gate electrode 235, and a gate dielectric layer 233 that are parallel to each other and extending in the first direction D1. Where, shallow trench isolation structures 241 are disposed in the doped regions 231 to isolate the gate electrode 235 and the gate dielectric layer 233 disposed between the two doped regions 231 by the shallow trench isolation structures 241. In this embodiment, the gate electrode 235 completely covers the underlying gate dielectric layer 233 and partially covers the doped regions 231 on two sides of the gate dielectric layer 233, so that the doped regions 231 are used as the source/drain regions of the transistor 230. The transistor 250 is disposed in the medium-voltage area 200M, and includes a doped region 251, a gate dielectric layer 253, and a gate electrode 255 that are parallel to each other and extending in the first direction D1. Where, the gate electrode 255 only partially covers the underlying gate dielectric layer 253 and the doped region 251, so that a portion of the doped region 251 is exposed from two sides of the gate electrode 255 and the gate dielectric layer 253, and used as the source/drain regions of the transistor 250. The transistor 260 is disposed in the low-voltage area 200L, and includes fin-shaped structures 224 and a gate electrode 265. The fin-shaped structures 224 are parallel to each other and extend in the first direction Dl. The gate electrode 265 extends in a second direction D2 perpendicular to the first direction D1 to cross the fin-shaped structures 224. In addition, the transistor 260 further includes multiple doped regions 261 in the fin-shaped structures 224 and located on two opposite sides of the gate electrode 265 to be used as the source/drain regions of the transistor 260.

Therefore, the semiconductor device 500 of this embodiment also includes the transistor 230 and the shallow trench isolation structures 241 disposed in the high-voltage area 200H, the transistor 250 and the shallow trench isolation structures 243 disposed in the medium-voltage area 200M, and the transistor 260 and the shallow trench isolation structures 242 disposed in the low-voltage area 200L. The topmost surfaces of the transistor 230, the transistor 250, and the transistor 260 are coplanar with each other. The top surfaces of the shallow trench isolation structures 241, the shallow trench isolation structures 243, and the shallow trench isolation structures 242 are also coplanar with each other to have the same depth as each other. Therefore, the semiconductor device 500 has good device performances.

In summary, the semiconductor devices of the present disclosure integrate the processes of forming high-voltage components, medium-voltage components, and low-voltage components, thereby simultaneously forming high-voltage transistors in the high-voltage area, medium-voltage transistors in the medium-voltage area, and low-voltage transistors in the low-voltage area of the semiconductor devices under simplified processes. Where, the high-voltage transistors and the medium-voltage transistors are partially embedded in the substrate to be coplanar with the bottom or the top surface of the fin portion of the low-voltage transistors. Therefore, the high-voltage transistors, the medium-voltage transistors, and the low-voltage transistors may have coplanar top surfaces to avoid forming shallow trench isolation structures with different depths, or to avoid serious load effect in the subsequent processes. Meanwhile, in the semiconductor devices of the present disclosure, the shallow trench isolation structures located in the high-voltage area, the medium-voltage area, and the low-voltage area, respectively, have the same depth, so that the top surfaces of the gate dielectric layers of the high-voltage transistor and the medium-voltage transistor are optionally coplanar with the top surface of the shallow trench isolation structures, thereby improving the performances of the semiconductor devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate, comprising a high-voltage area, a medium-voltage area, and a low-voltage area;
a first transistor, disposed in the high-voltage area, wherein the first transistor comprises:
a first gate dielectric layer, disposed on a first plane of the substrate; and
a first gate electrode, disposed on the first gate dielectric layer;
a second transistor, disposed in the low-voltage area, wherein the second transistor comprises:
a plurality of fin-shaped structures, protruding from a second plane of the substrate; and
a second gate electrode, crossing the plurality of fin-shaped structures; and
a third transistor, disposed in the medium-voltage area, wherein the third transistor comprises:
a third gate dielectric layer, disposed on a third plane of the substrate; and
a third gate electrode, disposed on the third gate dielectric layer, wherein a topmost surface of the first gate electrode, a topmost surface of the second gate electrode, and a topmost surface of the third gate electrode are coplanar with each other, and a bottommost surface of the second gate electrode is coplanar with a top surface of the first gate dielectric layer and a top surface of the third gate dielectric layer.

2. The semiconductor device of claim 1, further comprising:
a plurality of shallow trench isolation structures, disposed in the substrate and located in the high-voltage area, the medium-voltage area and the low-voltage area, respectively, wherein the plurality of shallow trench isolation structures include a same depth.

3. The semiconductor device of claim 2, wherein each of the plurality of fin-shaped structures comprises a fin portion protruding from a top surface of the plurality of shallow trench isolation structures, the top surface of the first gate dielectric layer is coplanar with a bottom surface of the fin portion and the top surface of the plurality of shallow trench isolation structures.

4. The semiconductor device of claim 1, wherein the third plane is higher than the second plane and the first plane, and the first plane is higher than the second plane.

5. The semiconductor device of claim 1, further comprising:
a protective structure, disposed in the substrate to surround the high-voltage area and the first transistor.

6. A method of fabricating a semiconductor device, comprising:
providing a substrate, wherein the substrate comprises a high-voltage area, a medium-voltage area, and a low-voltage area;
forming a first transistor in the high-voltage area, wherein the first transistor comprises:
a first gate dielectric layer, formed on a first plane of the substrate; and
a first gate electrode, formed on the first gate dielectric layer;
forming a second transistor in the low-voltage area, wherein the second transistor comprises:
a plurality of fin-shaped structures, protruding from a second plane of the substrate; and
a second gate electrode, crossing the plurality of fin-shaped structures; and
forming a third transistor in the medium-voltage area, wherein the third transistor comprises:
a third gate dielectric layer, formed on a third plane of the substrate; and
a third gate electrode, formed on the third gate dielectric layer, wherein the topmost surface of the first gate electrode, the topmost surface of the second gate electrode, and the topmost surface of the third gate electrode are coplanar with each other, and a bottommost surface of the second gate electrode is coplanar with a top surface of the first gate dielectric layer and a top surface of the third gate dielectric layer.

7. The method of fabricating a semiconductor device of claim 6, further comprising:
forming a plurality of shallow trench isolation structures in the substrate and located in the high-voltage area, the medium-voltage area and the low-voltage area, respectively, wherein the plurality of shallow trench isolation structures comprise the same depth, and each of the fin-shaped structures comprises a fin portion protruding from a top surface of the plurality of shallow trench isolation structures.

8. The method of fabricating a semiconductor device of claim 7, further comprising:
providing a bulk substrate, wherein the bulk substrate comprises a first region and a second region;
oxidizing a portion of the bulk substrate located in the first region; and
removing the portion of the bulk substrate, wherein the height of the portion is equal to the height of the fin portion.

9. The method of fabricating a semiconductor device of claim 8, further comprising:
after removing the portion, performing an etching process in the first region to form the first plane; and
forming the first gate dielectric layer on the first plane.

10. The method of fabricating a semiconductor device of claim 8, further comprising:

after removing the portion, performing a sidewall transfer process to form the fin-shaped structures and the second plane in the second region;

performing an etching process to partially remove the bulk substrate and the fin-shaped structures to form a plurality of trenches in the first region and the second region; and filling up the plurality of trenches with a dielectric layer.

11. The method of fabricating a semiconductor device of claim 10, wherein after filling up the plurality of trenches with the dielectric layer, an oxidation process is performed in the first region to form the third gate dielectric layer and the third plane.

12. The method of fabricating a semiconductor device of claim 11, further comprising:

after the third gate dielectric layer and the third plane are formed, performing an etch back process to partially remove the dielectric layer to form the plurality of shallow trench isolation structures.

13. The method of fabricating a semiconductor device of claim 6, further comprising:

forming a protective structure in the substrate to surround the high-voltage area and the first transistor.

\* \* \* \* \*